US012588431B2

(12) United States Patent
Chang et al.

(10) Patent No.: US 12,588,431 B2
(45) Date of Patent: Mar. 24, 2026

(54) SEMICONDUCTOR DEVICE WITH TWO-DIMENSIONAL MATERIALS AND FORMING METHOD THEREOF

(71) Applicants: TAIWAN SEMICONDUCTOR MANUFACTURING COMPANY, LTD., Hsinchu City (TW); National Yang Ming Chiao Tung University, Hsinchu City (TW)

(72) Inventors: Shu-Jui Chang, Hsinchu County (TW); Shin-Yuan Wang, Chiayi City (TW); Yu-Che Huang, Taipei City (TW); Chao-Hsin Chien, Hsinchu City (TW); Chenming Hu, Oakland, CA (US)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 273 days.

(21) Appl. No.: 18/308,106

(22) Filed: Apr. 27, 2023

(65) Prior Publication Data

US 2024/0363343 A1     Oct. 31, 2024

(51) Int. Cl.
| | |
|---|---|
| *H01L 21/02* | (2006.01) |
| *C30B 25/18* | (2006.01) |
| *C30B 29/40* | (2006.01) |
| *H10D 62/40* | (2025.01) |

(52) U.S. Cl.
CPC .......... *H01L 21/0262* (2013.01); *C30B 25/18* (2013.01); *C30B 29/406* (2013.01); *H10D 62/405* (2025.01)

(58) Field of Classification Search
CPC ....... C30B 25/18; C30B 25/183; C30B 29/02; C30B 29/406; C30B 29/46; C30B 29/60; H01L 21/02568; H01L 21/0262; H10D 62/405; H10D 62/80
See application file for complete search history.

(56) References Cited

U.S. PATENT DOCUMENTS

| | | | | |
|---|---|---|---|---|
| 2018/0151751 A1* | 5/2018 | Yeh | ......................... | H10D 99/00 |
| 2018/0351040 A1* | 12/2018 | Matias | ................ | H01L 21/0262 |

OTHER PUBLICATIONS

Chang et al, "van der Waals epitaxy of 2D h-AlN on TMDs by atomic layer deposition at 250 C," Appl. Phys. Lett. 120, 162102 (Year: 2022).*

Azcatl et al., "HfO2 on UV—O3 exposed transition metal dichalcogenides: interfacial reactions study", 2D Materials, vol. 2, No. 1, (2015) 014004, total 10 pages.

(Continued)

*Primary Examiner* — Hua Qi
(74) *Attorney, Agent, or Firm* — Birch, Stewart, Kolasch & Birch, LLP

(57) ABSTRACT

A method includes following steps. A single-crystalline two-dimensional (2D) semiconductor layer is formed over a substrate. A single-crystalline 2D material layer is epitaxially grown on the single-crystalline 2D semiconductor layer. The single-crystalline 2D material layer is lattice-matched with the single-crystalline 2D semiconductor layer. A semiconductor device is over the single-crystalline 2D semiconductor layer.

20 Claims, 32 Drawing Sheets

(56) References Cited

OTHER PUBLICATIONS

Chang et al., "van der Waals epitaxy of 2D h-AIN on TMDs by atomic layer deposition at 250° C.", Appl. Phys. Lett., vol. 120, 162102 (2022), total 7 pages.

Cheng et al., "4-Levels Vertically Stacked SiGe Channel Nanowires Gate-All-Around Transistor with Novel Channel Releasing and Source and Drain Silicide Process", Nanomaterials, vol. 12, No. 5, 889 (2022), total 10 pages.

Kim et al., "Origins of genuine Ohmic van der Waals contact between indium and MoS2", npj 2D Materials and Applications, 2021, vol. 5, No. 1, total 10 pages.

Zhang et al., "Interface Engineering for Atomic Layer Deposited Alumina Gate Dielectric on SiGe Substrates", ACS Appl. Mater. Interfaces, 2016, vol. 8, p. 19110-19118.

\* cited by examiner

102

100

302

300

322
320
304
302
300

324

320
304
302
300

SEMICONDUCTOR DEVICE WITH TWO-DIMENSIONAL MATERIALS AND FORMING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
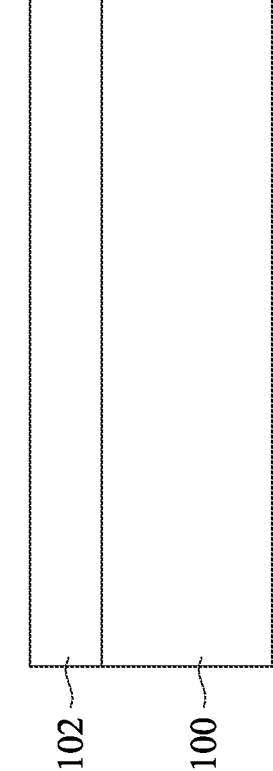
FIGS. 1A-3 are cross-sectional views of intermediate stages in forming a stack having an epitaxially grown 2D material layer, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be varied with the down-scaling of the integrated circuits.

With the progress of transistor process technology, the dimension of transistors has shrunk and therefore the number of transistors per unit area of an integrated circuit has increased accordingly. However, the off-state current has dramatically increased with further reduction in the channel length of a transistor, i.e., short channel effect. This effect is the major challenge of further increasing the density of transistors. Reducing the thickness of channel is known as one way of suppressing short channel effect. Two-dimensional (2D) semiconductors can serve as ultra-thin semiconductor channel material candidate to suppress the short channel effect. One advantageous feature of the 2D semiconductor material is the high electron mobility value, which is within a range of about 50-1000 $cm^2$/V-sec or even higher. It is understood that silicon, when formed to a low thickness (e.g., about 3 nm or lower) comparable with a thickness of a 2D semiconductor film, can have its mobility degraded drastically. Therefore, 2D semiconductor channel thickness can be scaled down with less impact on carrier mobility than silicon, which in turn achieves satisfactory channel mobility with only few nanometers in channel thickness (e.g., less than 3 nm). However, it is challenging to form single-crystalline materials over 2D semiconductor materials.

Therefore, the present disclosure provides various embodiments for forming a single-crystalline layer over a 2D semiconductor layer or other 2D material layers. Stated differently, epitaxially growth of a single-crystalline layer (e.g., single-crystalline metal layer, single-crystalline dielectric layer, or single-crystalline semiconductor layer) on a 2D material layer is achievable in various embodiments of the present disclosure. The epitaxial growth of a single-crystalline layer on a 2D material layer can be widely applied front-end-of-line (FEOL) processing in forming transistors and/or back-end-of-line (BEOL) processing in forming multilevel interconnects. For example, a single-crystalline 2D dielectric layer can be epitaxially grown on a 2D semiconductor layer to serve as a transistor gate dielectric, a single-crystalline 2D metal layer can be epitaxially grown on the single-crystalline 2D dielectric layer to serve as a transistor gate. The single-crystalline 2D metal layer, the single-crystalline 2D dielectric layer, and the 2D semiconductor layer can be formed of lattice-matched materials, which in turn will reduce the defect density and unwanted stain at the interface between adjacent layers, which in turn will lead to improved performance and reliability of semiconductor devices.

FIGS. 1A-3 are cross-sectional views of intermediate stages in forming a stack having an epitaxially grown 2D material layer, in accordance with some embodiments of the present disclosure. It is understood that additional operations can be provided before, during, and after processes shown by FIGS. 1A-3, and some of the operations described below can be replaced or eliminated, for additional embodiments of the method. The order of the operations/processes may be interchangeable.

In FIG. 1A, a substrate 100 is provided. In some embodiments, the substrate 100 may be a sapphire substrate. The sapphire substrate may be a c-plane sapphire substrate (sometimes referred to as a c-sapphire) substrate. In accordance with alternative embodiments, the substrates with other planes (such as M plane, R plane, or A plane) may be adopted. The substrate 100 may be in the form of a wafer, and may have a round top-view shape or a rectangular top-view shape. The diameter of substrate 100 may be 3 inch, 12 inch, or greater. In some embodiments, the substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multilayered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

A 2D semiconductor layer 102 is formed on the substrate 100. In some embodiments, the 2D semiconductor layer 102 is epitaxially grown on the single-crystalline substrate 100 for crystal orientation control. In particular, the 2D semiconductor layer 102 has an expected or controlled crystal orientation, depending on the crystal orientation of the underlying substrate 100. Crystal orientation can have a significant impact on the performance of transistors (e.g., speed, power consumption or the like). In particular, the orientation of the crystal lattice can affect the mobility of electrons or holes in the semiconductor material used to build the transistor. As a result, by controlling the crystal orientation of the 2D semiconductor layer 102, it can benefit performance of transistors having the 2D semiconductor layer 102 as channel regions.

The 2D semiconductor materials of the 2D semiconductor layer 102 are usually few-layer thick and exist as stacks of strongly bonded layers with weak interlayer van der Waals attraction, allowing the layers to be mechanically or chemically exfoliated into individual, atomically thin layers. The 2D semiconductor materials are promising candidates of the channel, source, drain materials of transistors. Examples of 2D semiconductor materials include transition metal dichalcogenides (TMDs), graphene, layered III-VI chalcogenide, graphene, hexagonal Boron Nitride (h-BN), black phosphorus or the like. The 2D semiconductor may include one or more layers and can have a thickness within the range of about 0.5-100 nm in some embodiments. One advantageous feature of the few-layered 2D semiconductor is the high electron mobility value, which is within a range of about 50-1000 cm$^2$/V-sec or even higher. It is understood that the bulk silicon, when cut to a low thickness (e.g., about 3 nm) comparable with a thickness of a 2D material film, may have its mobility degraded drastically.

In some embodiments, the 2D semiconductor layers 102 is a transition metal dichalcogenide (TMD) material which has the formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of dichalcogenide materials that are suitable for the 2D semiconductor layer 102 include $WS_2$, $MoS_2$, $WSe_2$, $MoSe_2$, $MoTe_2$, $WTe_2$, the like, or a combination thereof. However, any suitable transition metal dichalcogenide material may alternatively be used. Once formed, the transition metal dichalcogenide material is in a layered structure with a plurality of two-dimensional layers of the general form X-M-X, with the chalcogen atoms in two planes separated by a plane of metal atoms.

Figure 1B:
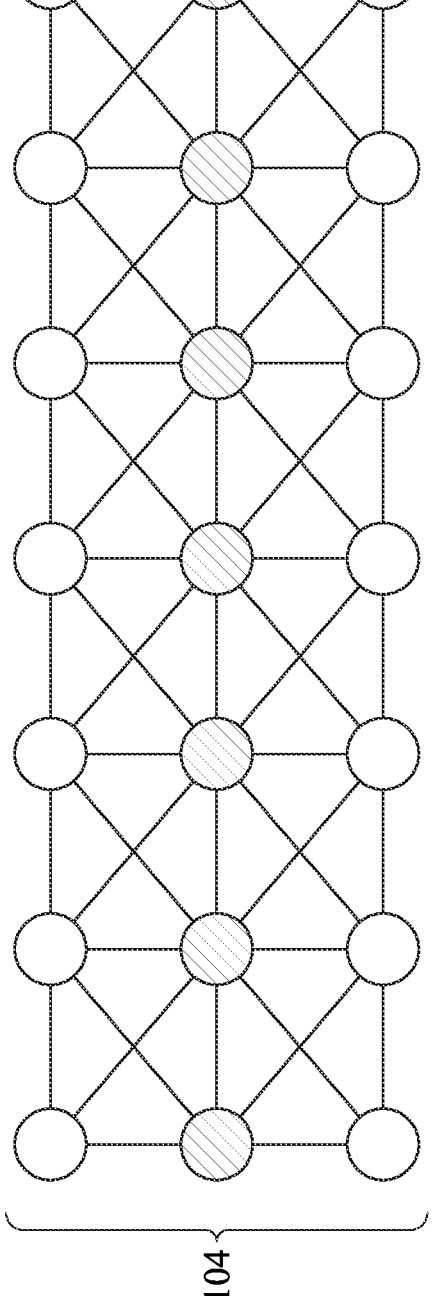

The 2D semiconductor layer 102 may be a mono-layer or may include a few mono-layers. FIG. 1B illustrates a schematic view of a mono-layer 103 of an example TMD in accordance with some example embodiments. In FIG. 1B, the one-molecule thick TMD material layer comprises transition metal atoms 103M and chalcogen atoms 103X. The transition metal atoms 103M may form a layer in a middle region of the one-molecule thick TMD material layer, and the chalcogen atoms 103X may form a first layer over the layer of transition metal atoms 103M, and a second layer underlying the layer of transition metal atoms 103M. The transition metal atoms 103M may be W atoms or Mo atoms, while the chalcogen atoms 103X may be S atoms, Se atoms, or Te atoms. In the example of FIG. 1B, each of the transition metal atoms 103M is bonded (e.g. by covalent bonds) to six chalcogen atoms 103X, and each of the chalcogen atoms 103X is bonded (e.g. by covalent bonds) to three transition metal atoms 103M. Throughout the description, the illustrated cross-bonded layers including one layer of transition metal atoms 103M and two layers of chalcogen atoms 103X in combination are referred to as a mono-layer 103 of TMD.

In some embodiments, the 2D semiconductor layer 102 is formed of tungsten disulfide ($WS_2$) by using, for example, an inductively-coupled-plasma (ICP) CVD process with $WF_6$ and $H_2S$ as precursors. For example, the $WS_2$ layer 102 can be deposited on the substrate 100 (e.g., sapphire) using a sulfur-containing gas (e.g., $H_2S$ gas) and a plasma generated from a tungsten-containing gas (e.g., $WF_6$). In some embodiments, the 2D semiconductor layer 102 is formed of molybdenum disulfide ($MoS_2$) by using CVD with $MoO_3$ and sulfur vapor as precursors. In some embodiments, the 2D semiconductor layer 102 may be deposited to have a thickness in a range from about 0.5 nm to about 10 nm (e.g., about 2 nm), depending on a total count of mono-layers. The process conditions are controlled to achieve the desirable total count of mono-layers 103 in a 2D semiconductor layer 102.

In some other embodiments, the 2D semiconductor layer 102 is formed using exfoliation and taping method. For example, a 2D semiconductor layer can be grown on another crystalline substrate with a desired crystal orientation by using suitable deposition techniques, and the 2D semiconductor layer 102 is then transferred onto the final substrate 100, which will serve as a supporting substrate of semiconductor devices (e.g., transistors) in a final integrated circuit (IC) product. For example, the 2D semiconductor layer grown on the crystalline substrate can be covered with a protection film (e.g., PMMA) and a thermal release tape, and then the 2D semiconductor layer is mechanically or chemically exfoliated from the crystalline substrate and then transferred onto the substrate 100. Next, the thermal release tape can be removed by, for example, baking the thermal release tape, so that the thermal release tape loses adhesiveness. Next, the protection film can be removed by, for example, etching or dissolving. After removal of the protection film, a 2D semiconductor layer 102 remains on the substrate 100, and is ready for epitaxial growth of a following 2D material.

Figure 2A:
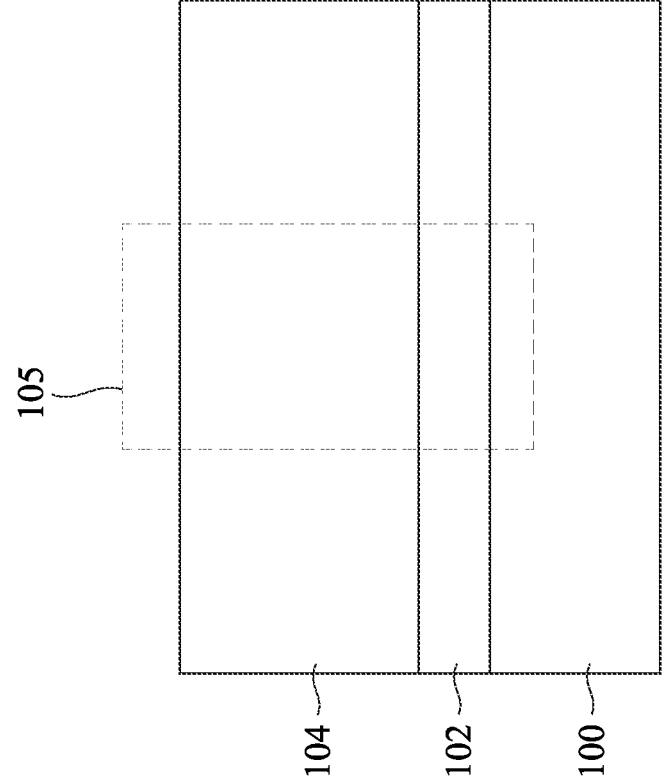

In FIG. 2A, a 2D crystal layer 104 is formed on the 2D semiconductor layer 102. In some embodiments, the 2D crystal layer 104 is formed of a material lattice-matched with the material of the 2D semiconductor layer 102. Lattice match refers to the condition in which the material of the 2D crystal layer 104 and the material of the 2D semiconductor layer 102 have similar or comparable lattice constants, which allows the 2D crystal layer 104 to be epitaxially grown as a single-crystalline 2D material layer with reduced strain and reduced defect formation. The lattice constant is the distance between the atomic planes in a crystal structure, and it can be expressed in units of nanometers or angstroms. When the lattice constants of the 2D crystal layer 104 and the 2D semiconductor layer 102 are closely matched, the atomic structures of the 2D crystal layer 104 and the 2D semiconductor layer 102 can align with each other, resulting in a regular and ordered crystal structure in the grown material in the 2D crystal layer 104. In contrast, if the layer grown on the 2D semiconductor layer 102 has a lattice constant significantly different than the underlying 2D semiconductor layer 102, atomic structures of the grown material may not be able to align with the underlying 2D semiconductor material properly, which in turn leads to unwanted lattice strain and defect formation in the grown material, which in turn causes failure in growing a single-crystalline material on the 2D semiconductor layer 102.

In some embodiments, lattice match is achieved between the 2D crystal layer 104 and the 2D semiconductor layer 102 when the difference between their lattice constants is less than 5% of the lattice constant of the 2D semiconductor layer 102. In some embodiments, lattice match is achieved between the 2D crystal layer 104 and the 2D semiconductor layer 102 when the difference between their lattice constants is less than 3% of the lattice constant of the 2D semiconductor layer 102. In further embodiments, lattice match is achieved between the 2D crystal layer 104 and the 2D semiconductor layer 102 when the difference between their lattice constants is less than 1.5% of the lattice constant of the 2D semiconductor layer 102. In some embodiments, the 2D semiconductor layer 102 is formed of $WS_2$ with a lattice constant of about 3.19 angstroms, or formed of $MoS_2$ with a lattice constant of about 3.19 angstroms.

In some embodiments, the 2D crystal layer 104 is a single-crystalline 2D dielectric layer formed of hexagonal aluminum nitride (h-AlN) with a lattice constant of about 3.13 angstroms, or formed of hexagonal gallium nitride (h-GaN) with a lattice constant of about 3.22 angstroms. Because a lattice constant difference between the selected 2D dielectric material (e.g., h-AlN or h-GaN) and the 2D semiconductor material (e.g., WS2 or MoS2) is less than 5% or even 1.5% of the lattice constant of the 2D semiconductor material, lattice match can be achieved between the grown 2D dielectric layer 104 and the underlying 2D semiconductor layer 102, which allows the 2D dielectric layer 104 to be epitaxially grown as a single-crystalline dielectric layer lattice-matched with the 2D semiconductor layer 102, instead of grown as an amorphous dielectric layer.

In some embodiments where the 2D crystal layer 104 is h-AlN and the 2D semiconductor layer 102 is $WS_2$, a single-crystalline 2D h-AlN layer 104 can be epitaxially grown on the 2D $WS_2$ layer 102 by using, for example, sputtering or atomic layer deposition (ALD) at a temperature lower than 400° C. As a result, the epitaxial growth of the 2D h-AlN layer 104 occurs at a lower temperature than the standard epitaxial growth process used for single-crystalline materials on 3D semiconductor materials like bulk silicon, which typically requires significantly higher temperatures (i.e., much higher than 400° C.).

In some embodiments, the 2D crystal layer 104 is a single-crystalline 2D metal layer formed of hexagonal hafnium (h-Hf) with a lattice constant of about 3.20 angstroms, or formed of hexagonal zirconium (h-Zr) with a lattice constant of about 3.23 angstroms. Because a lattice constant difference between the selected 2D metal material (e.g., h-Hf or h-Zr) and the 2D semiconductor material (e.g., $WS_2$ or $MoS_2$) is less than 5% or even 1.5% of the lattice constant of the 2D semiconductor material, lattice match can be achieved between the grown 2D metal layer 104 and the underlying 2D semiconductor layer 102, which allows the 2D metal layer 104 to be epitaxially grown as a single-crystalline metal layer lattice-matched with the 2D semiconductor layer 102, instead of being grown as polycrystalline or amorphous metal.

In some embodiments, the 2D crystal layer 104 is a single-crystalline 2D semiconductor layer formed of $WS_2$ with a lattice constant of about 3.19 angstroms, or formed of $MoS_2$ with a lattice constant of about 3.19 angstroms. Because the lattice constant difference between the selected 2D semiconductor material of the 2D crystal layer 104 and the underlying 2D semiconductor layer 102 is zero, lattice match can be achieved between the grown 2D crystal layer 104 and the underlying 2D semiconductor layer 102, which allows the 2D crystal layer 104 to be epitaxially grown as a single-crystalline semiconductor layer lattice-matched with the underlying 2D semiconductor layer 102. In some embodiments, the 2D crystal layer 104 is formed of a single-crystalline 2D semiconductor material different from the material of the 2D semiconductor layer 102, but has a same lattice constant as the material of the 2D semiconductor layer 102. For example, when the 2D semiconductor layer 102 is formed of $WS_2$, the 2D crystal layer 104 can be formed of $MoS_2$. Alternatively, when the 2D semiconductor layer 102 is formed of $MoS_2$, the 2D crystal layer 104 is formed of $WS_2$.

Figure 2B:
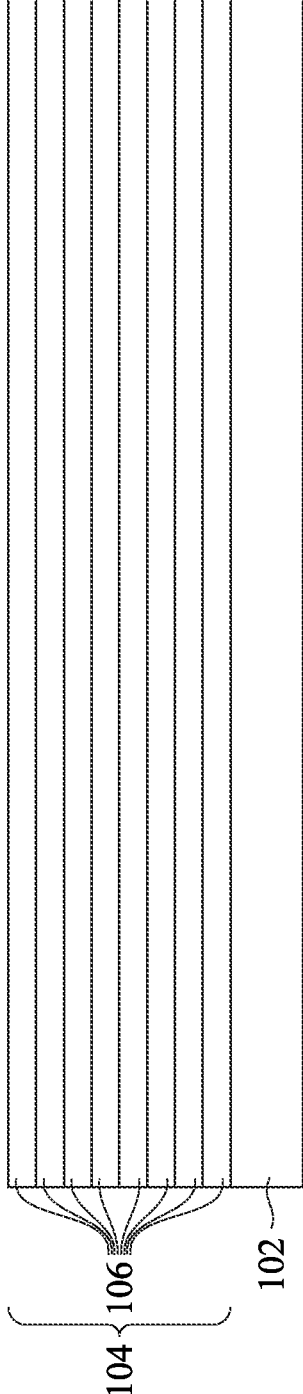

FIG. 2B is a zoomed-in view of a partial region 105 of the lattice-matched stack as illustrated in FIG. 2A. In some embodiments, as illustrated in FIG. 2B, the 2D crystal layer 104 includes a plurality of monolayers 106. Each monolayer is composed of a single atomic layer of the 2D crystal material. The monolayers 106 can be stacked on top of each other to form a thicker 2D crystal layer 104. In some implementations, the number of monolayers 106 in the 2D crystal layer 104 can be precisely controlled during the growth process. For example, the number of monolayers 106 can be controlled by adjusting the deposition time, the precursor concentration, or the growth rate during the growth process. The resulting 2D crystal layer 104 has a well-controlled thickness, which provides a high degree of precision and accuracy for device fabrication. Specifically, the thickness of the 2D crystal layer 104 may be tailored by controlling the number of monolayers 106 that are deposited on the 2D semiconductor layer 102. In some embodiments, the thickness of the 2D crystal layer 104 may be between 1 and 20 monolayers. In other embodiments, the thickness of the 2D crystal layer 104 may be greater or less than this range, depending on the desired properties of the resulting structure. In the depicted embodiment, the 2D crystal layer 104 has a thickness greater than a thickness of the 2D semiconductor layer 102. For example, the 2D crystal layer 104 may consist of a greater number of monolayers compared to the 2D semiconductor layer 102, allowing the 2D crystal layer 104 to be formed with a greater thickness than the 2D semiconductor layer 102.

Figure 3:
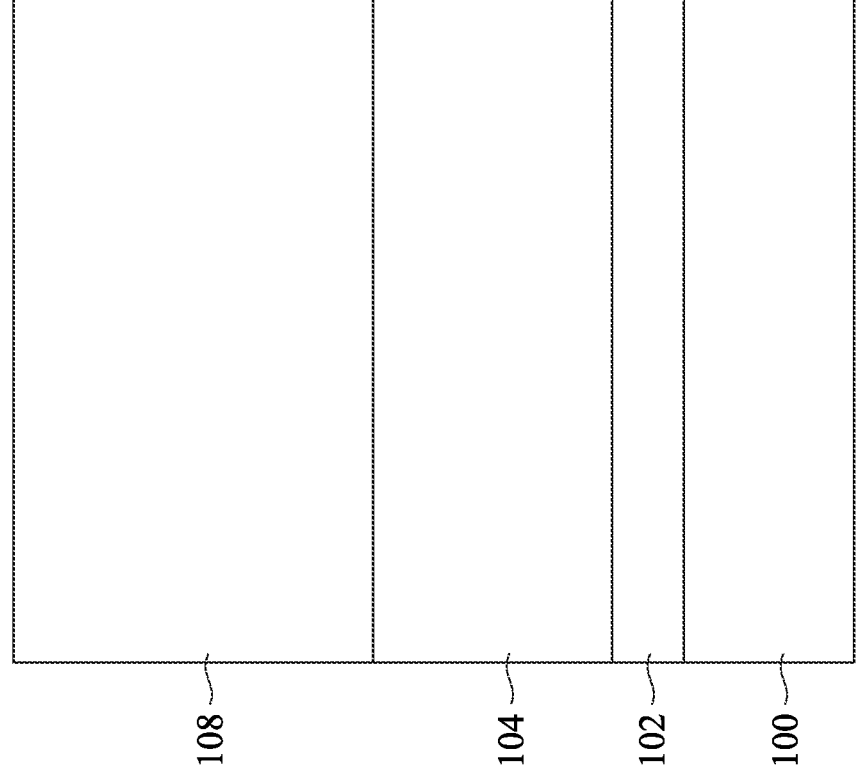

In FIG. 3, a functional layer 108 is formed over the 2D crystal layer 104 to serve a particular function in semiconductor devices, and thus semiconductor devices (e.g., transistors) can be formed over the 2D semiconductor layer 102 by using the stack of layers 102, 104 and 108. In some embodiments, the functional layer 108 is a 2D crystal layer formed of a material lattice-matched with the material of the 2D crystal layer 104. Lattice match refers to the condition in which the material of the functional layer 108 and the material of the 2D crystal layer 104 have similar or comparable lattice constants, which allows the functional layer 108 to be epitaxially grown as a single-crystalline layer with reduced strain and reduced defect formation. When the lattice constants of the functional layer 108 and the 2D crystal layer 104 are closely matched, the atomic structures of the functional layer 108 and the 2D crystal layer 104 can align with each other, resulting in a regular and ordered crystal structure in the grown material in the functional layer 108.

In some embodiments, lattice match is achieved between the functional layer 108 and the 2D crystal layer 104 when the difference between their lattice constants is less than 5% of the lattice constant of the 2D crystal layer 104. In some embodiments, lattice match is achieved between the functional layer 108 and the 2D crystal layer 104 when the difference between their lattice constants is less than 3% of the lattice constant of the 2D crystal layer 104. In further embodiments, lattice match is achieved between the functional layer 108 and the 2D crystal layer 104 when the difference between their lattice constants is less than 1.5% of the lattice constant of the 2D crystal layer 104. In some embodiments, the functional layer 108 is a single-crystalline 2D dielectric layer formed of hexagonal aluminum nitride (h-AlN) with a lattice constant of about 3.13 angstroms, or formed of hexagonal gallium nitride (h-GaN) with a lattice constant of about 3.22 angstroms. In some embodiments, the functional layer 108 is a single-crystalline 2D metal layer formed of hexagonal hafnium (h-Hf) with a lattice constant of about 3.20 angstroms, or formed of hexagonal zirconium (h-Zr) with a lattice constant of about 3.23 angstroms. In some embodiments, the functional layer 108 is a single-crystalline 2D semiconductor layer formed of $WS_2$ with a lattice constant of about 3.19 angstroms, or formed of $MoS_2$ with a lattice constant of about 3.19 angstroms. The single-crystalline 2D dielectric layer may serve as a gate dielectric, the single-crystalline 2D metal layer may serve as a gate metal, and the single-crystalline 2D semiconductor layer may serve as a transistor channel.

In some embodiments, the functional layer 108 is a 3D crystal layer formed of a material lattice-matched with the material of the 2D crystal layer 104. Lattice match refers to the condition in which the material of the functional layer 108 and the material of the 2D crystal layer 104 have similar or comparable lattice constants, which allows the functional layer 108 to be epitaxially grown as a single-crystalline layer with reduced strain and reduced defect formation. When the lattice constants of the functional layer 108 and the 2D crystal layer 104 are closely matched, the atomic structures of the functional layer 108 and the 2D crystal layer 104 can align with each other, resulting in a regular and ordered crystal structure in the grown material in the functional layer 108. In some embodiments, the functional layer 108 is a single-crystalline 3D metal layer formed of cubic molybdenum (Mo) with a lattice constant of about 3.15 angstroms, cubic tungsten (W) with a lattice constant of about 3.16 angstroms, hexagonal hafnium with a lattice constant of about 3.20 angstroms, or hexagonal zirconium with a lattice constant of about 3.23 angstroms. The 3D crystal metal layer may serve as a gate metal.

In some embodiments, the functional layer 108 is single-crystalline titanium nitride (TiN) grown on the 2D crystal layer 104 (e.g., 2D h-AlN layer) by using ALD at a temperature lower than 400° C. As a result, the epitaxial growth of the functional layer 108 occurs at a lower temperature than the standard epitaxial growth process used for single-crystalline TiN on 3D semiconductor materials like bulk silicon, which typically requires significantly higher temperatures (i.e., much higher than 400° C.).

In some embodiments, the functional layer 108 is a non-crystalline layer (e.g., amorphous layer) formed of a non-crystalline material lattice-mismatched with the 2D crystal layer 104. The functional layer 108 may be, for example, a high-k dielectric layer serving for a high-k/metal gate (HKMG) structure. The 2D crystal layer 104 can serve as an interfacial layer between the 2D semiconductor layer 102 and the functional layer 108, so as to improve the interface between two dissimilar materials (i.e., the 2D semiconductor material and the non-crystalline material). The interfacial layer 108 may enhance the adhesion between the dissimilar materials, reduce the amount of defects or impurities at the interface, and improve the performance of the resulting device.

In some embodiments where the functional layer 108 is a high-k dielectric layer, it may include dielectric materials having a high dielectric constant, for example, greater than that of thermal silicon oxide (about 3.9-4.0). The high-k dielectric material may include, by way of example and not limitation, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide ($La_2O_3$), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

In some embodiments, the functional layer 108 is non-crystalline aluminum oxide ($Al_2O_3$) grown on the 2D crystal layer 104 (e.g., 2D h-AlN layer) by using ALD at a temperature lower than 400° C. In some embodiments, the functional layer 108 is non-crystalline palladium (Pd) grown on the 2D crystal layer 104 (e.g., 2D h-Hf layer) by using e-gun evaporation at a temperature lower than 400° C. Different from ALD, e-gun evaporation is a physical vapor deposition technique for depositing a non-crystalline material onto the 2D crystal layer 104. It involves the use of an electron gun, also known as an e-gun, to create a high-energy electron beam that is directed towards a source material of Pd. The electron beam is used to heat the source material of Pd, causing it to evaporate and form a vapor that condenses onto the 2D crystal layer 104 as a non-crystalline Pd film.

FIGS. 4-7 are cross-sectional views of intermediate stages in forming a transistor having an epitaxially grown single-crystalline 2D gate stack, in accordance with some embodiments of the present disclosure. It is understood that additional operations can be provided before, during, and after processes shown by FIGS. 4-7, and some of the operations described below can be replaced or eliminated, for additional embodiments of the method. The order of the operations/processes may be interchangeable.

Figure 4:
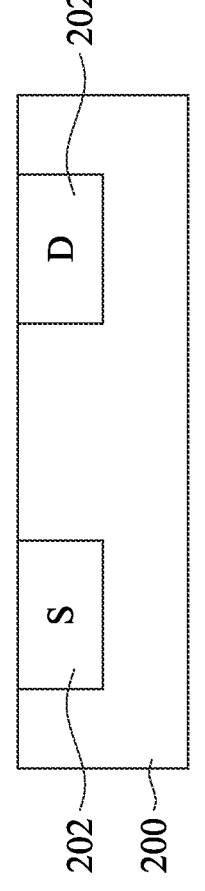
FIGS. 4-7 are cross-sectional views of intermediate stages in forming a transistor having an epitaxially grown single-crystalline 2D gate stack, in accordance with some embodiments of the present disclosure.

In FIG. 4, source/drain regions 202 (denoted as "S" and "D" in FIG. 4) are formed in a substrate 200. In some embodiments, the substrate 200 is a semiconductor substrate similar to the substrate 100, and thus example materials of the substrate 200 are not repeated for the sake of brevity. Source/drain regions 202 are semiconductor regions in direct contact with the substrate 200. In some embodiments, the source/drain regions 202 may be formed, for example, by implanting dopants (e.g., As, P, B, In, or the like) using an ion implantation process. In some embodiments, the source/drain regions 202 may comprise epitaxially grown regions. For example, the source/drain regions 202 may be formed by first etching the substrate 200 to form recesses, and then depositing a single-crystalline semiconductor material in the recess by a selective epitaxial growth (SEG) process that may fill the recess and may extend further beyond the original surface of the substrate 200 to form raised source/drain epitaxy structures. The single-crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of n-type dopant or p-type dopant may be introduced into the epitaxial grown regions 202 either in situ during SEG, or by an ion implantation process performed after the SEG, or by a combination thereof. In these embodiments, regions of the substrate 200 except for the source/drain regions 202 may be masked by using a patterned photoresist prior to the ion implantation and/or epitaxial growth process. After the formation of the source/drain regions 202, the patterned photoresist can be removed from the substrate 200, for example, using a plasma ashing process.

Figure 5:
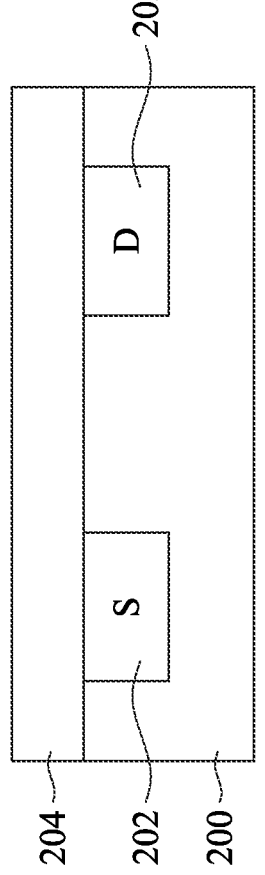

In FIG. 5, a single-crystalline 2D semiconductor layer 204 is formed over the substrate 200 and the source/drain regions 202. In some embodiments, the 2D semiconductor layer 204 is formed by CVD growth on the substrate 200. In some other embodiments, the 2D semiconductor layer 204 is formed using exfoliation and taping method. For example, a 2D semiconductor layer can be grown on another single-crystalline substrate with a desired crystal orientation by using suitable deposition techniques, and the 2D semiconductor layer 204 is then transferred onto the substrate 200. Materials and other details about the 2D semiconductor layer 204 are similar to the 2D semiconductor layer 102 described previously with respect to FIGS. 1A and 1B, and thus are not repeated for the sake of brevity.

Figure 6:
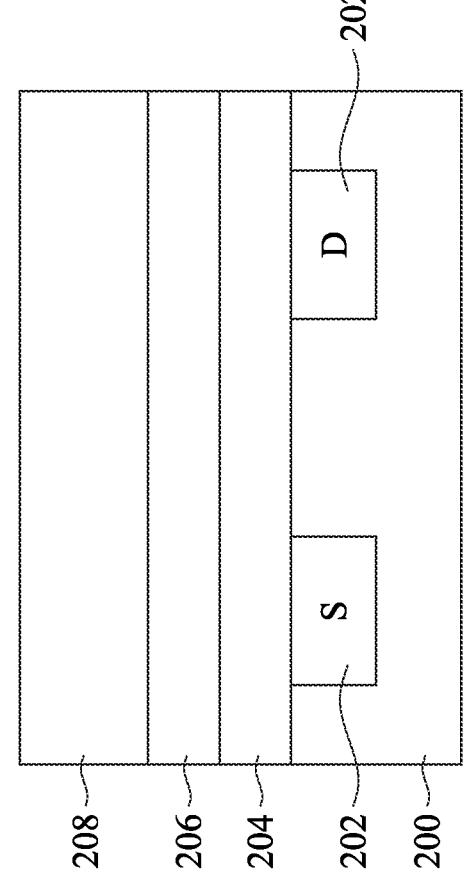

In FIG. 6, a single-crystalline 2D dielectric layer 206 is epitaxially grown on the 2D semiconductor layer 204. In some embodiments, the single-crystalline 2D dielectric layer 206 is a single-crystalline 2D dielectric layer formed of hexagonal aluminum nitride (h-AlN) with a lattice constant of about 3.13 angstroms, or formed of hexagonal gallium nitride (h-GaN) with a lattice constant of about 3.22 angstroms. Because a lattice constant difference between the selected 2D dielectric material (e.g., h-AlN or h-GaN) of the single-crystalline 2D dielectric layer 206 and the underlying 2D semiconductor material (e.g., $WS_2$ or $MoS_2$) of the single-crystalline 2D semiconductor layer 204 is less than 5% or even 1.5% of the lattice constant of the 2D semiconductor material, lattice match can be achieved between the grown 2D dielectric layer 206 and the underlying 2D semiconductor layer 204, which allows the 2D dielectric layer 206 to be epitaxially grown as a single-crystalline dielectric layer 206 lattice-matched with the 2D semiconductor layer 204, instead of grown as an amorphous dielectric layer. In some embodiments where the single-crystalline 2D dielectric layer 206 is h-AlN and the 2D semiconductor layer 204 is $WS_2$, a single-crystalline 2D h-AlN layer 206 can be epitaxially grown on the 2D $WS_2$ layer 204 by using, for example, sputtering or atomic layer deposition (ALD) at a temperature lower than 400° C.

In some embodiments, the 2D dielectric layer 206 has a thickness greater than the thickness of the 2D semiconductor layer 204. For example, the 2D dielectric layer 206 may consist of a greater number of monolayers compared to the 2D semiconductor layer 204, allowing the 2D dielectric layer 206 to be formed with a greater thickness than the 2D semiconductor layer 204. The controlled thickness of the 2D dielectric layer 206 allows for reducing leakage current and improving device performance and/or reliability. More particularly, if the thickness of the 2D dielectric layer 206 is too thin (e.g., thinner than 1 angstroms), then the leakage current through the 2D dielectric layer 206 may be significant, which can result in increased power consumption, reduced device reliability, and even device failure. On the other hand, if the thickness of the 2D dielectric layer 206 is too thick (e.g., thicker than 500 angstroms), then the capacitance between the 2D metal gate 210 and a 2D semiconductor channel in the 2D semiconductor layer 204 may be reduced, which can result in decreased device performance. Therefore, controlling the thickness of the 2D dielectric layer 206 helps in achieving the desired balance between leakage current and device performance.

After forming the single-crystalline 2D dielectric layer 206, a single-crystalline 2D metal layer 208 is epitaxially grown on the single-crystalline 2D dielectric layer 206. In some embodiments, the single-crystalline 2D metal layer 208 is formed of hexagonal hafnium (h-Hf) with a lattice constant of about 3.20 angstroms, or formed of hexagonal zirconium (h-Zr) with a lattice constant of about 3.23 angstroms. Because a lattice constant difference between the selected 2D metal material (e.g., h-Hf or h-Zr) and underlying 2D dielectric material (e.g., h-AlN or h-GaN) of the single-crystalline 2D dielectric layer 206 is less than 5% or even 1.5% of the lattice constant of the 2D dielectric material, lattice match can be achieved between the grown 2D metal layer 208 and the underlying 2D dielectric layer 206, which allows the 2D metal layer 208 to be epitaxially grown as a single-crystalline metal layer 208 lattice-matched with the 2D dielectric layer 206, instead of being grown as polycrystalline or amorphous metal. In some embodiments, the 2D metal layer 208 has a thickness greater than the thickness of the 2D dielectric layer 206 and the 2D semiconductor layer 204. For example, the 2D metal layer 208 may consist of a greater number of monolayers compared to the 2D dielectric layer 206 and the 2D semiconductor layer 204, allowing the 2D metal layer 208 to be formed with a greater thickness than the 2D dielectric layer 206 and the 2D semiconductor layer 204.

Figure 7:
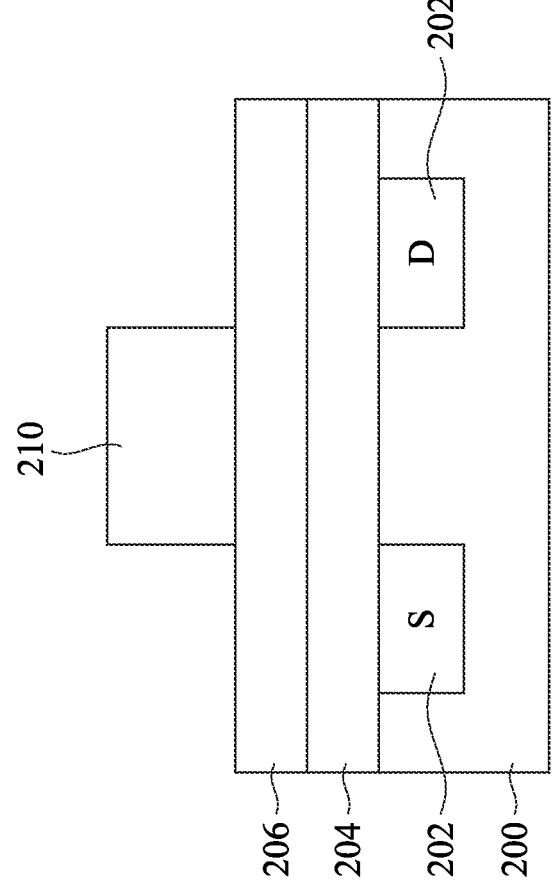

In FIG. 7, the 2D metal layer 208 is patterned into a 2D metal gate 210 by using suitable photolithography and etching techniques. For example, a photoresist material is deposited over the 2D metal layer 208 and then exposed to light through a mask that defines the desired metal gate pattern. The exposed photoresist is then developed, leaving a patterned mask on the 2D metal layer 208. The exposed metal areas can then be etched using a suitable etchant, such as a wet chemical etchant or a dry etchant, to remove the unwanted metal and leave the patterned 2D metal gate 210. The photoresist mask is then stripped to complete the patterning process. In some embodiments, the 2D metal layer 208 can be etched using a selective metal etching process that removes the 2D metal from without affecting the underlying 2D dielectric layer 206. The selective etching process may involve the use of an etchant that specifically targets the 2D metal while leaving the 2D dielectric layer 206 intact. This can be achieved through the use of specialized chemistries, such as wet etchants or plasma etchants, which are selective to the particular 2D metal being etched. Specifically, the etchant can be selected such that the 2D dielectric has a higher etch resistance to the selective etchant than that of the 2D metal.

Figure 8:
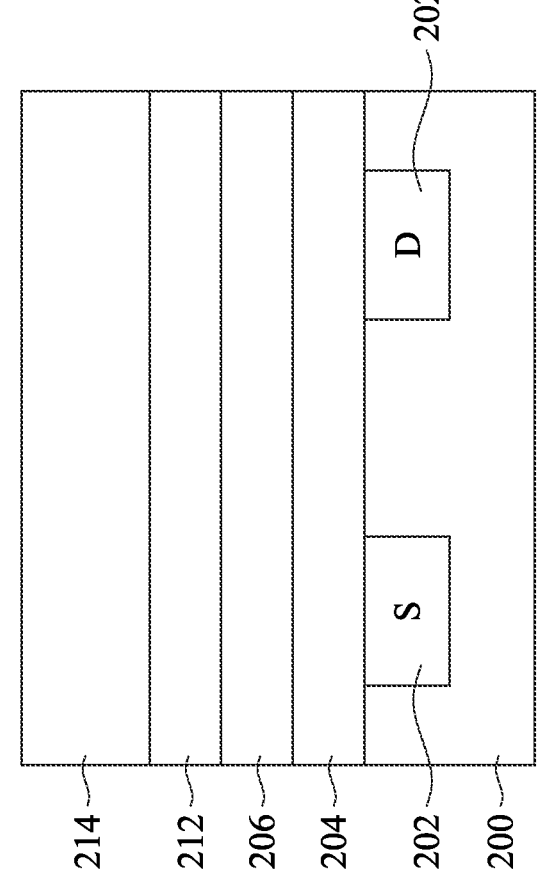
FIGS. 8-9 are cross-sectional views of intermediate stages in forming a transistor having an epitaxially grown 2D gate dielectric and a non-crystalline gate dielectric over the 2D gate dielectric, in accordance with some alternative embodiments of the present disclosure.
Figure 9:
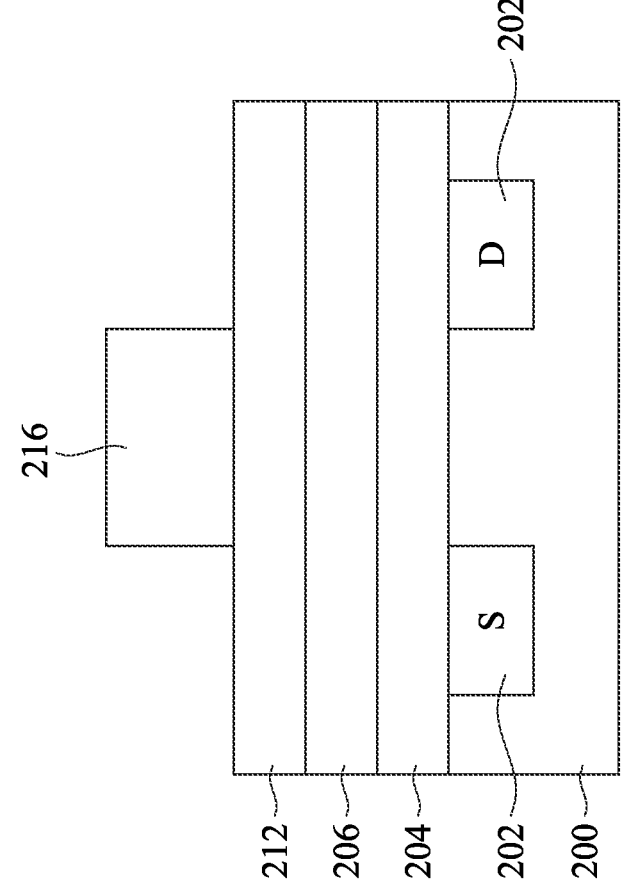

FIGS. 8-9 are cross-sectional views of intermediate stages in forming a transistor having an epitaxially grown 2D gate dielectric and a non-crystalline gate dielectric over the 2D gate dielectric, in accordance with some alternative embodiments of the present disclosure. It is understood that additional operations can be provided before, during, and after processes shown by FIGS. 8-9.

The structure illustrated in FIG. 8 is similar to that illustrated in FIG. 6, except that a non-crystalline dielectric layer 212 is formed on the single-crystalline 2D dielectric layer 206, and a gate metal layer 214 is formed on the non-crystalline dielectric layer 212. In some embodiments, the non-crystalline dielectric layer 212 is a high-k dielectric layer serving for a high-k/metal gate (HKMG) structure. The 2D dielectric layer 206 can serve as an interfacial layer between the 2D crystal layer 104 and the non-crystalline dielectric layer 212, so as to improve the interface between two dissimilar materials (i.e., the 2D semiconductor material and the non-crystalline dielectric material).

In some embodiments where the non-crystalline dielectric layer 212 is a high-k dielectric layer, it may include dielectric materials having a high dielectric constant, for example, greater than that of thermal silicon oxide (about 3.9-4.0). The high-k dielectric material may include, by way of example and not limitation, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (La$_2$O$_3$), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (Ba-TiO$_3$, BTO), barium zirconium oxide (BaZrO), hafnium lanthanum oxide (HfLaO), lanthanum silicon oxide (La-SiO), aluminum silicon oxide (AlSiO), aluminum oxide (Al$_2$O$_3$), silicon nitride (Si$_3$N$_4$), oxynitrides (SiON), and combinations thereof. The high-k dielectric layer 212 can be formed by using an ALD process, although other suitable deposition techniques are also feasible. In some embodiments, the gate metal layer 214 is a non-crystalline metal, such as polycrystalline metal. Polycrystalline metals may contain numerous small crystal structures that are oriented in different directions, resulting in a more disordered arrangement of atoms. Examples of polycrystalline metals include, for example, polycrystalline copper, polycrystalline aluminum, polycrystalline titanium, and polycrystalline nickel. The gate metal layer 214 can be formed by using an ALD process, although other suitable deposition techniques are also feasible.

In FIG. 9, the gate metal layer 214 is patterned in to a metal gate 216 by using suitable photolithography and etching techniques, as discussed previously with respect to the formation of 2D metal gate 210.

FIGS. 10-15 are cross-sectional views of intermediate stages in forming a transistor having an epitaxially grown single-crystalline 2D gate stack, in accordance with some embodiments of the present disclosure. It is understood that additional operations can be provided before, during, and after processes shown by FIGS. 10-15, and some of the operations described below can be replaced or eliminated, for additional embodiments of the method. The order of the operations/processes may be interchangeable.

Figure 10:
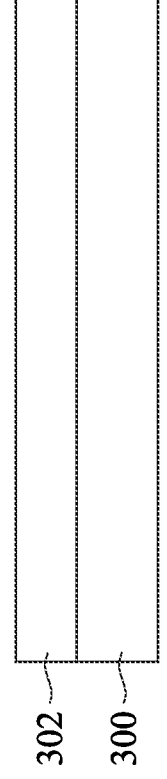
FIGS. 10-15 are cross-sectional views of intermediate stages in forming a transistor having an epitaxially grown single-crystalline 2D gate stack, in accordance with some embodiments of the present disclosure.

In FIG. 10, a single-crystalline 2D semiconductor layer 302 is formed on the substrate 300. In some embodiments, the substrate 300 is a semiconductor substrate similar to the substrate 100, and thus example materials of the substrate 300 are not repeated for the sake of brevity. In some embodiments, the 2D semiconductor layer 302 is formed by CVD growth on the substrate 300. In some other embodiments, the 2D semiconductor layer 302 is formed using exfoliation and taping method. For example, a 2D semiconductor layer can be grown on another single-crystalline substrate with a desired crystal orientation by using suitable deposition techniques, and the 2D semiconductor layer 302 is then transferred onto the substrate 300. Materials and other details about the 2D semiconductor layer 302 are similar to the 2D semiconductor layer 102 described previously with respect to FIGS. 1A and 1B, and thus are not repeated for the sake of brevity.

Figure 11:
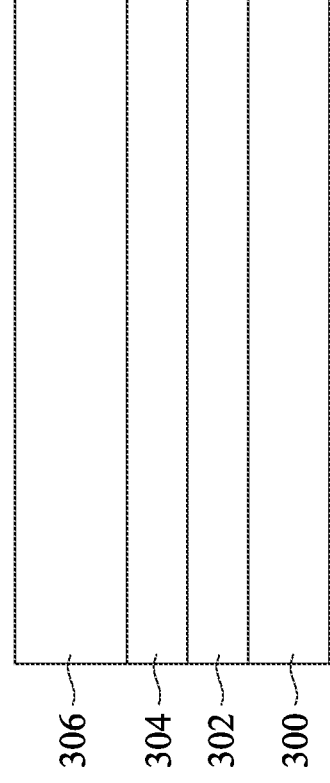

In FIG. 11, a single-crystalline 2D dielectric layer 304 is epitaxially grown on the 2D semiconductor layer 302. In some embodiments, the single-crystalline 2D dielectric layer 304 is a single-crystalline 2D dielectric layer formed of hexagonal aluminum nitride (h-AlN) with a lattice constant of about 3.13 angstroms, or formed of hexagonal gallium nitride (h-GaN) with a lattice constant of about 3.22 angstroms. Because a lattice constant difference between the selected 2D dielectric material (e.g., h-AlN or h-GaN) of the single-crystalline 2D dielectric layer 304 and the underlying 2D semiconductor material (e.g., WS$_2$ or MoS$_2$) of the single-crystalline 2D semiconductor layer 302 is less than 5% or even 1.5% of the lattice constant of the 2D semiconductor material, lattice match can be achieved between the grown 2D dielectric layer 304 and the underlying 2D semiconductor layer 302, which allows the 2D dielectric layer 304 to be epitaxially grown as a single-crystalline dielectric layer 304 lattice-matched with the 2D semiconductor layer 302, instead of grown as an amorphous dielectric layer. In some embodiments where the single-crystalline 2D dielectric layer 304 is h-AlN and the 2D semiconductor layer 302 is WS$_2$, a single-crystalline 2D h-AlN layer 304 can be epitaxially grown on the 2D WS$_2$ layer 302 by using, for example, sputtering or atomic layer deposition (ALD) at a temperature lower than 400° C. In some embodiments, the 2D dielectric layer 304 has a thickness greater than the thickness of the 2D semiconductor layer 302. For example, the 2D dielectric layer 304 may consist of a greater number of monolayers compared to the 2D semiconductor layer 302, allowing the 2D dielectric layer 304 to be formed with a greater thickness than the 2D semiconductor layer 302.

A single-crystalline 2D metal layer 306 is then epitaxially grown on the single-crystalline 2D dielectric layer 304. In some embodiments, the single-crystalline 2D metal layer 306 is formed of hexagonal hafnium (h-Hf) with a lattice constant of about 3.20 angstroms, or formed of hexagonal zirconium (h-Zr) with a lattice constant of about 3.23 angstroms. Because a lattice constant difference between the selected 2D metal material (e.g., h-Hf or h-Zr) and underlying 2D dielectric material (e.g., h-AlN or h-GaN) of the single-crystalline 2D dielectric layer 304 is less than 5% or even 1.5% of the lattice constant of the 2D dielectric material, lattice match can be achieved between the grown 2D metal layer 306 and the underlying 2D dielectric layer 304, which allows the 2D metal layer 306 to be epitaxially grown as a single-crystalline metal layer lattice-matched with the 2D dielectric layer 304, instead of being grown as polycrystalline or amorphous metal. In some embodiments, the 2D metal layer 306 has a thickness greater than the thickness of the 2D dielectric layer 304 and the 2D semiconductor layer 302. For example, the 2D metal layer 306 may consist of a greater number of monolayers compared to the 2D dielectric layer 304 and the 2D semiconductor layer 302, allowing the 2D metal layer 306 to be formed with a greater thickness than the 2D dielectric layer 304 and the 2D semiconductor layer 302.

Figure 12:
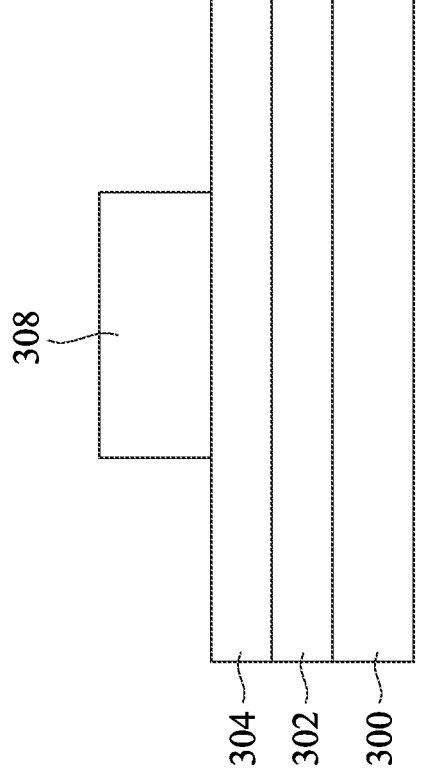

In FIG. 12, the 2D metal layer 306 is patterned in to a 2D metal gate 308 by using suitable photolithography and etching techniques. For example, a photoresist material is deposited over the 2D metal layer 306 and then exposed to light through a mask that defines the desired metal gate pattern. The exposed photoresist is then developed, leaving a patterned mask on the 2D metal layer 306. The exposed metal areas can then be etched using a suitable etchant, such as a wet chemical etchant or a dry etchant, to remove the unwanted metal and leave the patterned 2D metal gate 308. The photoresist mask is then stripped to complete the patterning process. In some embodiments, the 2D metal layer 306 can be etched using a selective metal etching process, as discussed previously.

Figure 13:
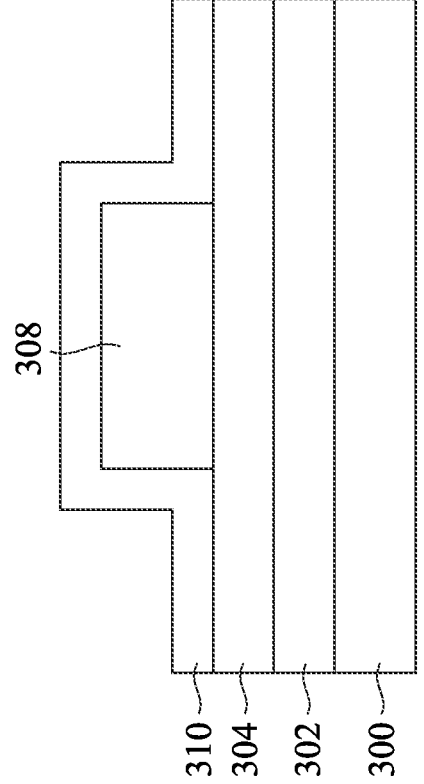

In FIG. 13, a spacer layer 310 is blanket formed over the substrate 300. The spacer layer 310 will be subsequently patterned to act as gate spacers for forming self-aligned source/drain regions. The spacer layer 310 covers a top surface and sidewalls of the 2D metal gate 308. In some embodiments, the spacer layer 310 may be formed of silicon oxide, silicon nitride, silicon oxynitride, or the like, using techniques such as CVD, ALD, or the like.

Figure 14:
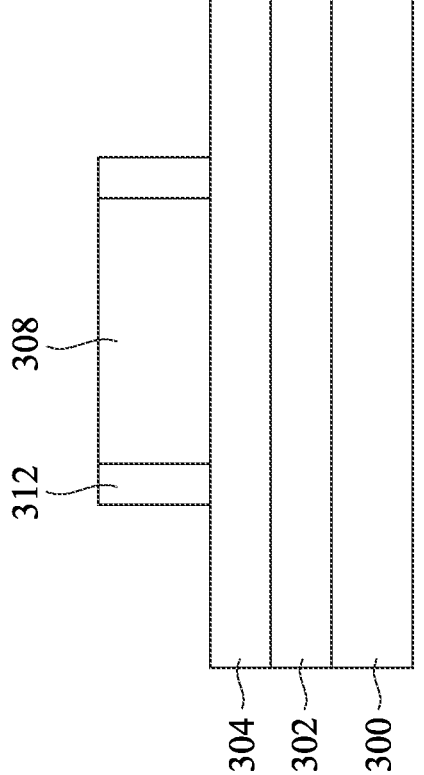

In FIG. 14, the spacer layer 310 is etched to form gate spacers 312 on opposite sidewalls of the 2D metal gate 308. As will be discussed in greater detail below, the gate spacers 312 act to self-align subsequently formed source/drain regions. The spacer layer 310 may be etched using a suitable etching process, such as an isotropic etching process (e.g., a wet etching process), an anisotropic etching process (e.g., a dry etching process), or the like. In some embodiments, the material of the 2D dielectric layer 304 may have a different etch rate than the material of the spacer layer 310, such that the 2D dielectric layer 304 may act as an etch stop layer when patterning the spacer layer 310 into the gate spacers 312.

Figure 15:
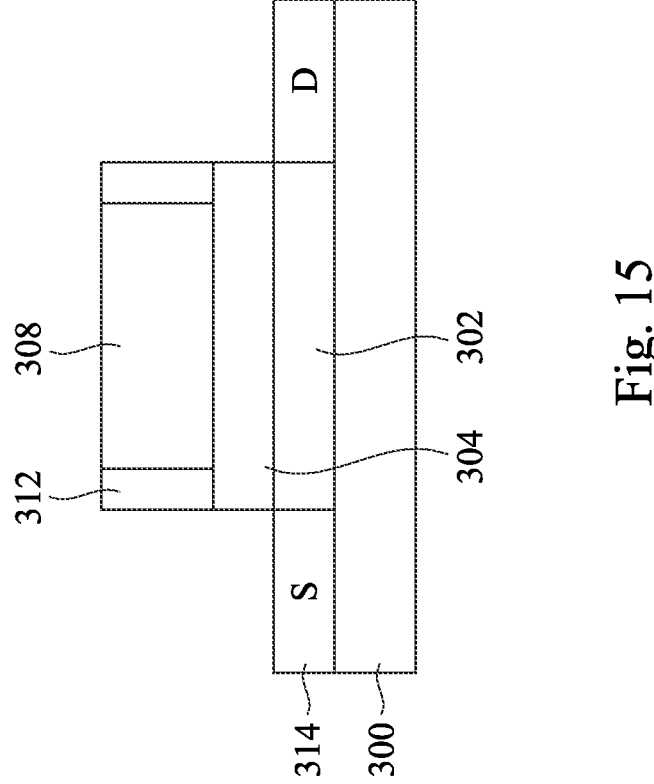

In FIG. 15, the 2D dielectric layer 304 is etched by using the gate spacers 312 and the 2D metal gate 308 as an etch mask, resulting in portions of the 2D semiconductor layer 302 exposed by the 2D dielectric layer 304. Next, source/drain regions 314 are formed in the exposed portions of the 2D semiconductor layer 302. In some embodiments, the source/drain regions 314 are formed, for example, by implanting suitable n-type or p-type dopants (e.g., As, P, B, In, or the like) using an ion implantation process into the exposed portions of the 2D semiconductor layer 302.

FIGS. 16-19 are cross-sectional views of intermediate stages in forming a transistor having an epitaxially grown 2D gate dielectric and a non-crystalline gate dielectric over the 2D gate dielectric, in accordance with some alternative embodiments of the present disclosure. It is understood that additional operations can be provided before, during, and after processes shown by FIGS. 16-19. It is understood that additional operations can be provided before, during, and after processes shown by FIGS. 16-19, and some of the operations described below can be replaced or eliminated, for additional embodiments of the method. The order of the operations/processes may be interchangeable.

Figure 16:
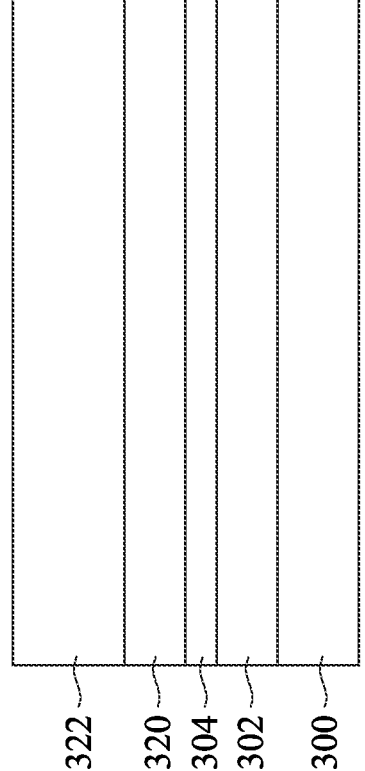
FIGS. 16-19 are cross-sectional views of intermediate stages in forming a transistor having an epitaxially grown 2D gate dielectric and a non-crystalline gate dielectric over the 2D gate dielectric, in accordance with some alternative embodiments of the present disclosure.

The structure illustrated in FIG. 16 is similar to that illustrated in FIG. 11, except that a non-crystalline dielectric layer 320 is formed on the single-crystalline 2D dielectric layer 304, and a gate metal layer 322 is formed on the non-crystalline dielectric layer 320. In some embodiments, the non-crystalline dielectric layer 320 is a high-k dielectric layer serving for a high-k/metal gate (HKMG) structure. The 2D dielectric layer 304 can serve as an interfacial layer between the 2D semiconductor layer 302 and the non-crystalline dielectric layer 320, so as to improve the interface between two dissimilar materials (i.e., the 2D semiconductor material and the non-crystalline dielectric material). Example materials and formation methods of the non-crystalline dielectric layer 320 and the gate metal layer 322 are similar to that of the non-crystalline dielectric layer 212 and the gate metal layer 214 discussed previously, and thus not repeated for the sake of brevity.

Figure 17:
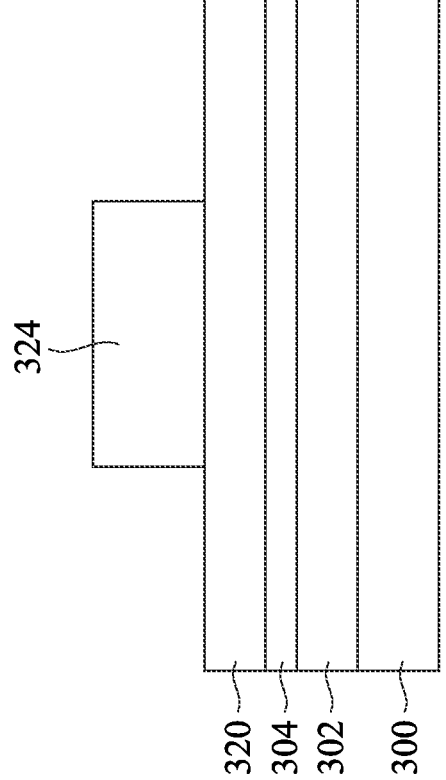

In FIG. 17, the gate metal layer 322 is patterned in to a metal gate 324 by using suitable photolithography and etching techniques, as discussed previously with respect to the formation of 2D metal gate 210.

Figure 18:
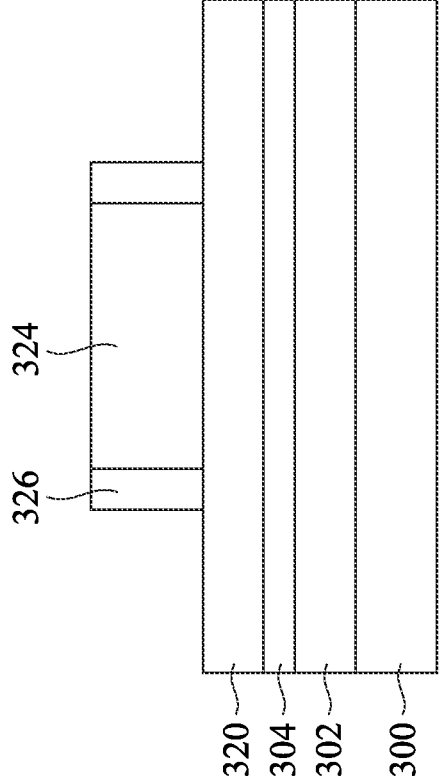

In FIG. 18, gate spacers 326 are formed on opposite sidewalls of the metal gate 324. In some embodiments, the gate spacers 326 may be formed by depositing a spacer layer over the metal gate 324, followed by etching the spacer layer to remove horizontal portions of the spacer layer, while leaving vertical portions of the spacer layer to serve as gate spacers 326. In some embodiments, the spacer layer 310 may be formed of silicon oxide, silicon nitride, silicon oxynitride, or the like.

Figure 19:
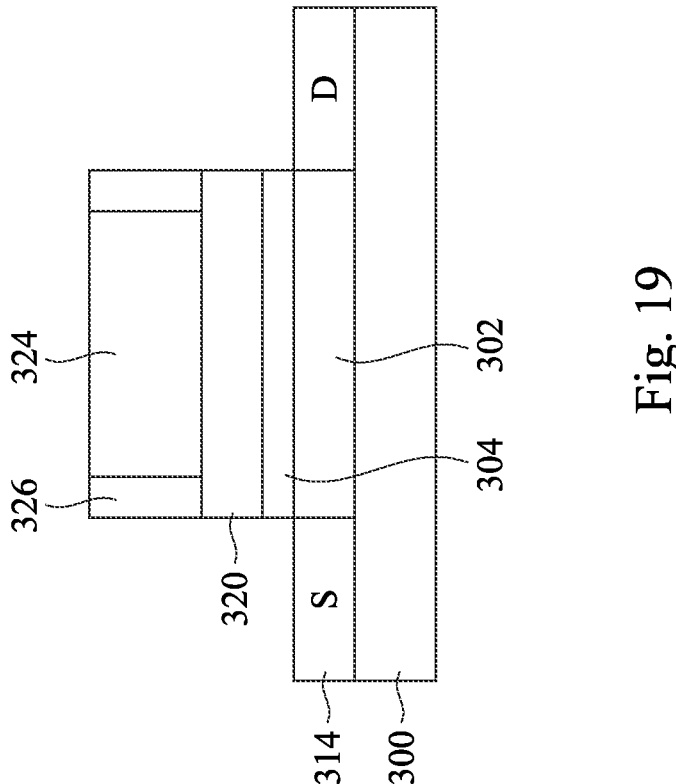

In FIG. 19, the non-crystalline dielectric layer 320, and the single-crystalline 2D dielectric layer 304 are etched by using the gate spacers 326 and the metal gate 324 as an etch mask, resulting in portions of the 2D semiconductor layer 302 exposed by the non-crystalline dielectric layer 320 and the 2D dielectric layer 304. Next, source/drain regions 314 are formed in the exposed portions of the 2D semiconductor layer 302. In some embodiments, the source/drain regions 314 are formed, for example, by implanting suitable n-type or p-type dopants (e.g., As, P, B, In, or the like) using an ion implantation process into the exposed portions of the 2D semiconductor layer 302.

Figure 20:
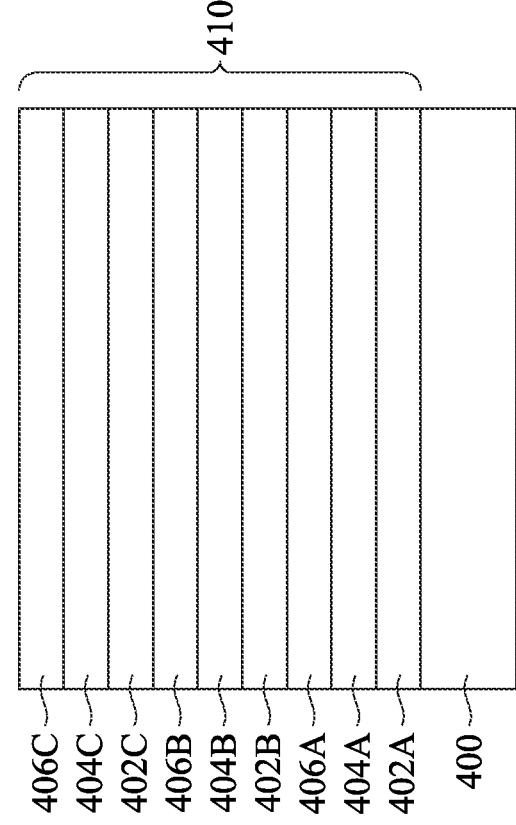
FIGS. 20-22 are cross-sectional views of intermediate stages in forming a multilayer stack including a plurality of 2D material layers, in accordance with some alternative embodiments of the present disclosure.
Figure 21:
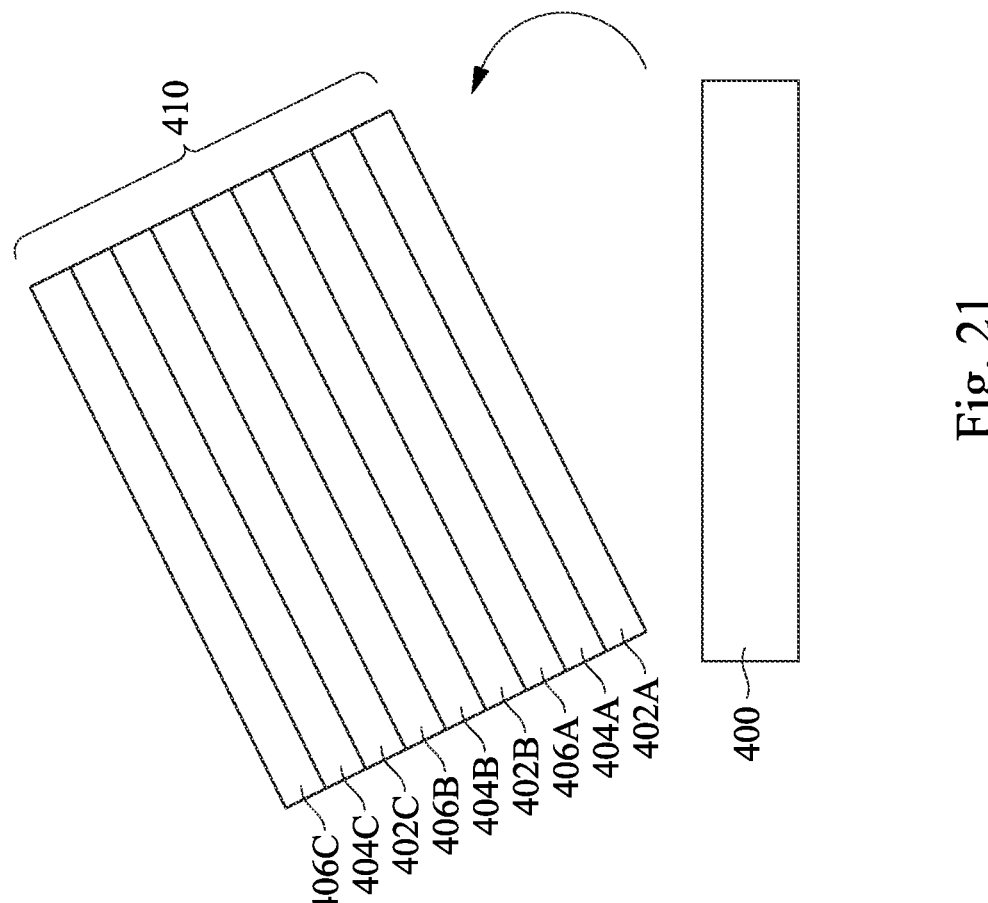
Figure 22:
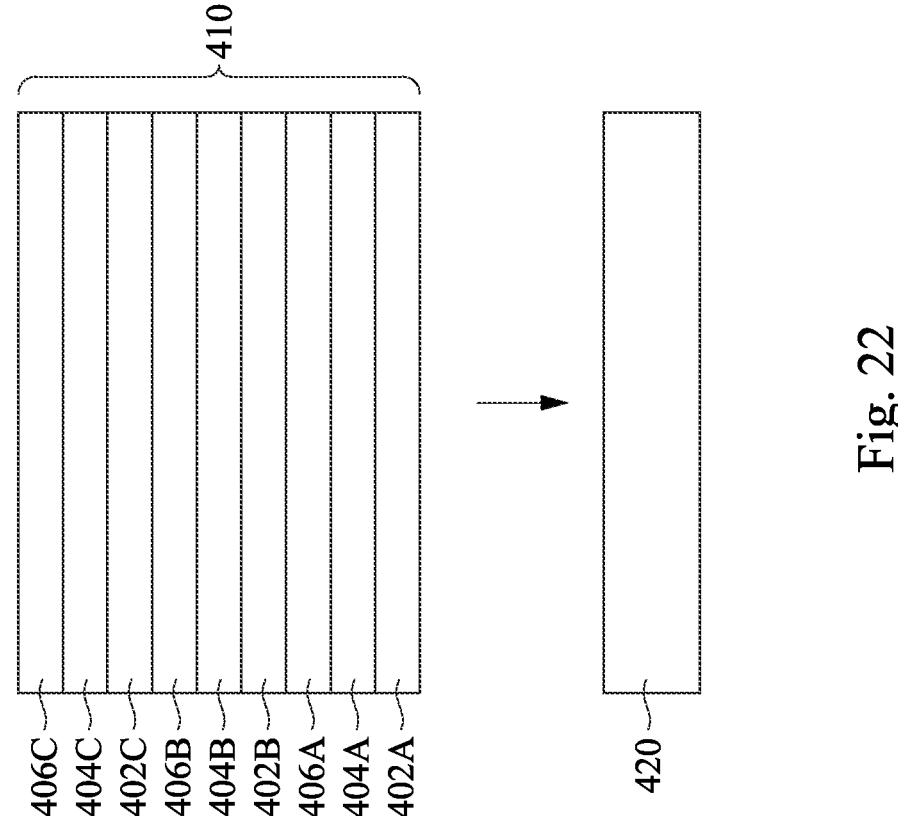

FIGS. 20-22 are cross-sectional views of intermediate stages in forming a multilayer stack including a plurality of 2D material layers, in accordance with some alternative embodiments of the present disclosure. It is understood that additional operations can be provided before, during, and after processes shown by FIGS. 20-22.

In FIG. 20, a multilayer stack 410 is formed on a crystalline substrate 400 for crystal orientation control. In some embodiments, the crystalline substrate 400 may comprise, for example, bulk silicon, doped or undoped, or an active layer of a semiconductor-on-insulator (SOI) substrate. In some embodiments, the crystalline substrate 400 may comprise a sapphire substrate. The sapphire substrate 400 may be a c-plane sapphire substrate (sometimes referred to as a c-sapphire) substrate. In accordance with alternative embodiments, the substrates with other planes (such as M plane, R plane, or A plane) may be adopted. Substrate 400 may be in the form of a wafer, and may have a round top-view shape or a rectangular top-view shape. The diameter of substrate 400 may be 3 inch, 12 inch, or greater. In some embodiments, the crystalline substrate 200 is a single-crystalline substrate so that each 2D material layer in the multilayer stack 410 may be a single-crystalline structure with a controlled crystal orientation attributed to the crystalline substrate 400.

In some embodiments, the multilayer stack 410 includes alternating layers of 2D semiconductor layers 402A-C (collectively referred to as 2D semiconductor layers 402), 2D dielectric layers 404A-C (collectively referred to as 2D dielectric layers 404), and 2D metals 406A-C (collectively referred to as 2D metal layers 406). The multilayer stack 410 is illustrated as including three layers of each of the 2D semiconductor layers 402, 2D dielectric layers 404, and 2D metal layers 406 for illustrative purposes. In some embodiments, the multilayer stack 410 may include any number of the 2D semiconductor layers 402, 2D dielectric layers 404, and 2D metal layers 406. Materials of each of the 2D semiconductor layers 402, 2D dielectric layers 404, and 2D metal layers 406 are selected to have similar or comparable lattice constants, such that lattice match can be achieved between adjacent layers in the multilayer stack 410. Therefore, a lattice-matched single-crystalline 2D metal/insulator/semiconductor (MIS) structure can be formed on the crystalline substrate 400. The selected candidate materials of 2D semiconductor, 2D dielectric, and 2D metal are discussed previously with respect to the 2D crystal layer 104, and thus not repeated for the sake of brevity.

In FIG. 21, the multilayer stack 410 is mechanically or chemically exfoliated from the underlying crystalline substrate 400, and then transferred onto another substrate 420, as illustrated in FIG. 22. The substrate 420 will serve as a supporting substrate of semiconductor devices (e.g., transistors) in a final integrated circuit (IC) product. For example, the multilayer stack 410 grown on the crystalline substrate 400 can be covered with a protection film (e.g., PMMA) and a thermal release tape, and then the multilayer stack 410 is mechanically or chemically exfoliated from the crystalline substrate 400 and then transferred onto the substrate 420. Next, the thermal release tape can be removed by, for example, baking the thermal release tape, so that the thermal release tape loses adhesiveness. Next, the protection film can be removed by, for example, etching or dissolving. After removal of the protection film, the multilayer stack 410 remains on the substrate 420, and is ready for following processing of forming semiconductor devices (e.g., transistors).

FIGS. 23-29B are cross-sectional views of intermediate stages in forming a gate-all-around (GAA) transistor having an epitaxially grown 2D semiconductor layer and an epitaxially grown 2D dielectric layer, in accordance with some embodiments of the present disclosure. It is understood that additional operations can be provided before, during, and after processes shown by FIGS. 23-29B, and some of the operations described below can be replaced or eliminated, for additional embodiments of the method. The order of the operations/processes may be interchangeable.

Figure 23:
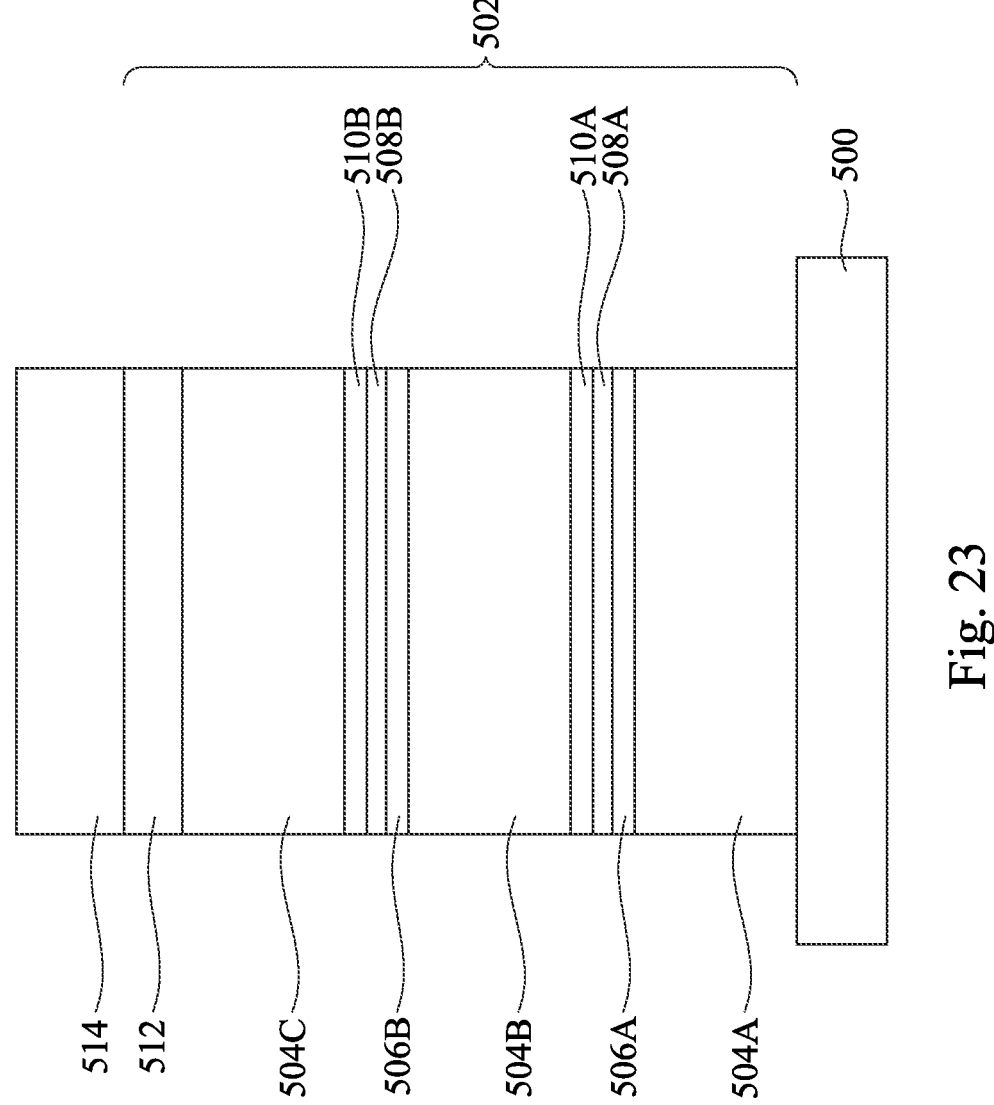
FIGS. 23-29B are cross-sectional views of intermediate stages in forming a gate-all-around (GAA) transistor having an epitaxially grown 2D semiconductor layer and an epitaxially grown 2D dielectric layer, in accordance with some embodiments of the present disclosure.

In FIG. 23, a multilayer stack 502 is formed on a substrate 500 by a deposition method, or by an exfoliation and taping method, as discussed above. The multilayer stack 502 includes alternating layers of sacrificial epitaxial layers 504A-C (collectively referred to as sacrificial epitaxial layers 504), single-crystalline 2D dielectric layers 506A-B (collectively referred to as single-crystalline 2D dielectric layers 506), single-crystalline 2D semiconductor layers 508A-B (collectively referred to as single-crystalline 2D semiconductor layers 508), and single-crystalline 2D dielectric layers 510A-B (collectively referred to as single-crystalline 2D dielectric layers 510). Materials of each of the single-crystalline layers 504-510 are selected to have similar or comparable lattice constants, such that lattice match can be achieved between adjacent layers in the multilayer stack 502. The lattice-matched multilayer stack 502 is patterned in one or more etching processes by using a first hard mask 512 and a second hard mask 514 as an etch mask. In some embodiments, the first hard mask 512 and the second hard mask are formed of different dielectric materials, such as silicon nitride, silicon oxynitride, silicon oxide, or the like.

Figure 24:
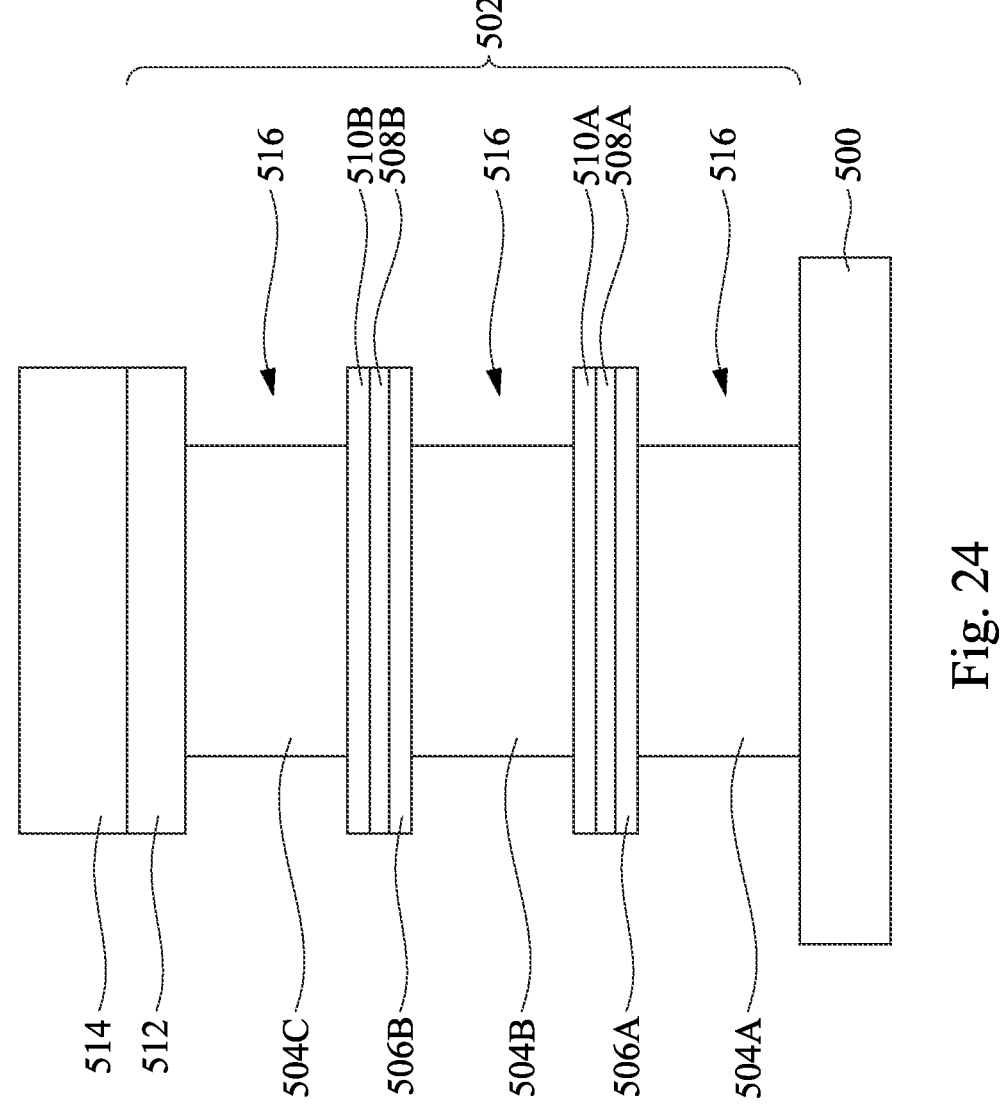

In FIG. 24, sidewalls of the sacrificial epitaxial layers 504 are etched to form sidewall recesses 516 in the multilayer stack 502. Although sidewalls of the sacrificial epitaxial layers 504 in recesses 516 are illustrated as being straight in FIG. 24, the sidewalls may be concave or convex. The sidewalls may be etched using a selective etching process that removes materials of the sacrificial layers 504 without affecting the 2D dielectric layers 506, 510, and the 2D semiconductor layers 508. The selective etching process may involve the use of an etchant that specifically targets the sacrificial materials while leaving the 2D dielectric layers 506, 510, and the 2D semiconductor layers 508 intact. This can be achieved through the use of specialized chemistries, such as wet etchants or plasma etchants, which are selective to the particular sacrificial material being etched. Specifically, the etchant can be selected such that the 2D dielectric layers 506, 510, and the 2D semiconductor layers 508 have a higher etch resistance to the selective etchant than that of the sacrificial layers 504.

Figure 25:
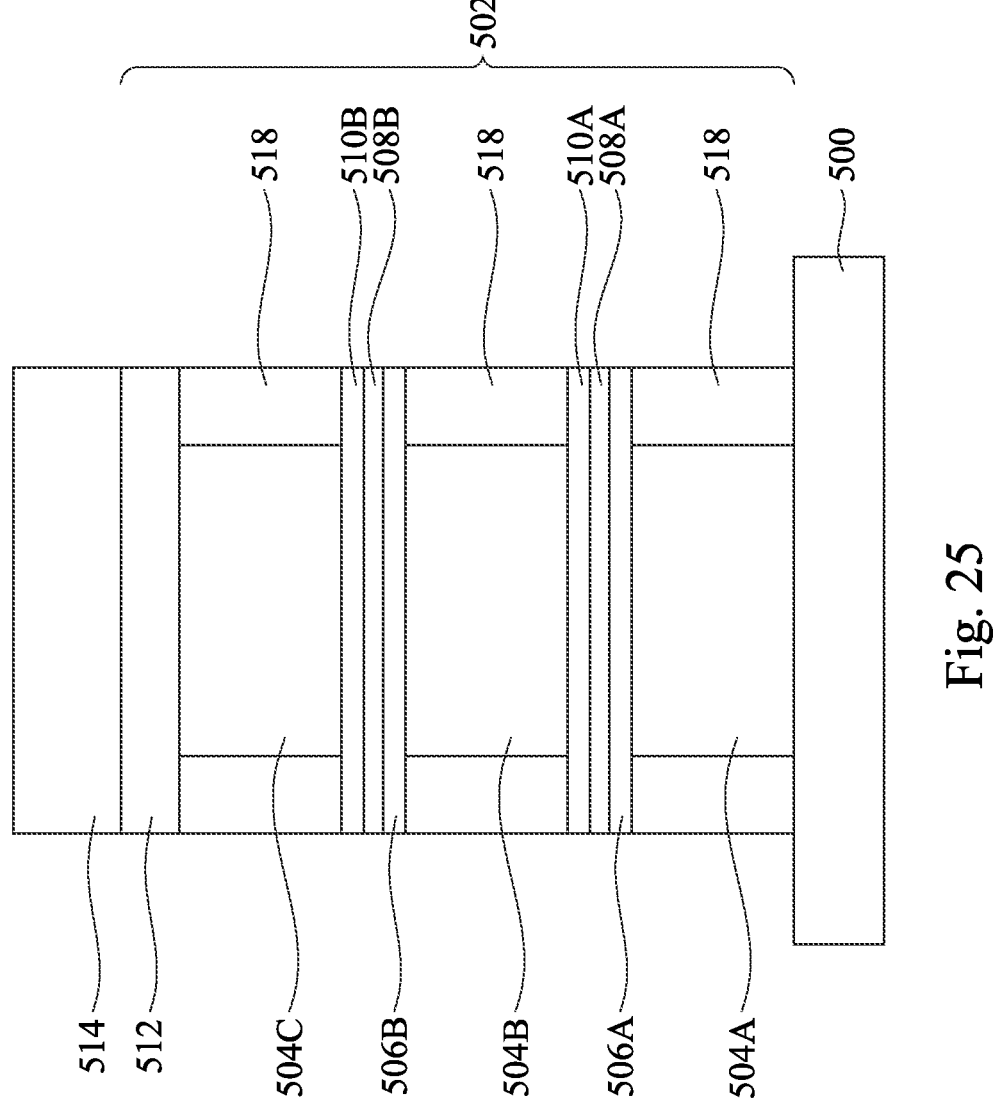

In FIG. 25, inner spacers 518 are formed in the sidewall recesses 516. The inner spacers 518 may be formed by depositing an inner spacer layer (not separately illustrated) over the structure illustrated in FIG. 24. The inner spacers 518 act as isolation features between subsequently formed source/drain regions and gate structure. The inner spacer layer may be deposited by a deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 518. Although outer sidewalls of the inner spacers 518 are illustrated as being flush with sidewalls of the 2D dielectric layers 506, 510, and the 2D semiconductor layers 508, the outer sidewalls of the inner spacers 518 may extend beyond or be recessed from sidewalls of the 2D dielectric layers 506, 510, and the 2D semiconductor layers 508.

Figure 26:
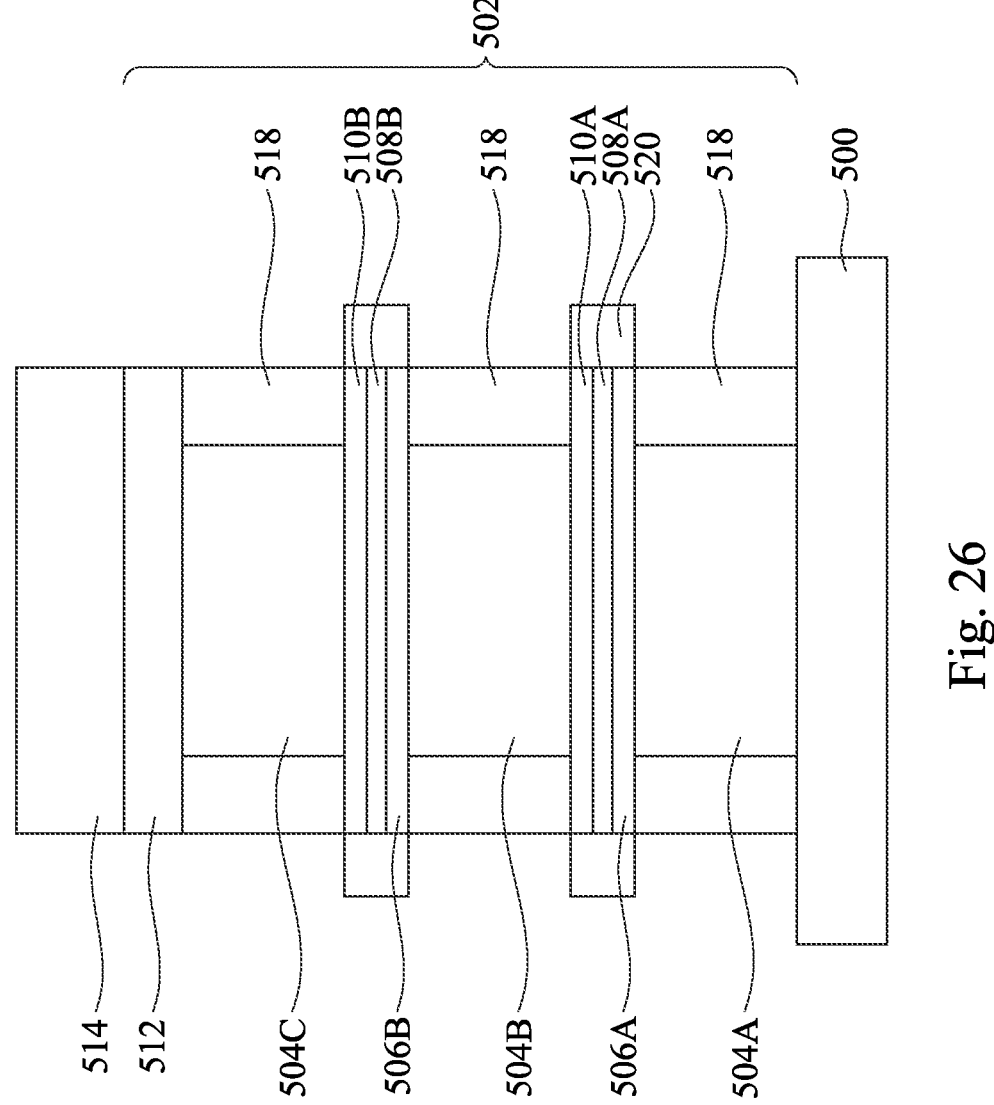

In FIG. 26, source/drain regions 520 are formed on exposed sidewalls of the 2D semiconductor layers 508 and the 2D dielectric layers 506, 510. In some embodiments, the source/drain regions are metals selected for forming Schottky contacts with the 2D semiconductor material of the 2D semiconductor layers 508, which in turn will be advantageous for lowering source/drain resistance. In some embodiments, the source/drain regions 520 are formed using a selective deposition process that may be used to deposit metal onto 2D semiconductor layers 508 without significant deposition on 3D materials of the substrate 500, inner spacers 518, and hard masks 512, 514. This selective deposition process may be accomplished by choosing a suitable precursor gas and process conditions that are compatible with the 2D semiconductor layers 508 and not with the 3D materials. This may be achieved by using a deposition precursor that reacts specifically with the 2D materials, while being unreactive or having a significantly lower reactivity with the 3D materials. The selective deposition process may be performed using a variety of suitable techniques, including but not limited to atomic layer deposition (ALD), chemical vapor deposition (CVD), and molecular beam epitaxy (MBE).

In some embodiments, the metal source/drain regions 520 are formed of metal(s) having a band-edge work function close to the conduction band of the 2D semiconductor material (e.g., TMD), allowing for electrons flowing laterally between the source/drain regions 520 through the 2D semiconductor layers 508 when the resultant transistor is turned on, and thus the resultant transistor can act as an n-type transistor. In some embodiments where the 2D semiconductor material is TMD, the metal having a band-edge work function close to the conduction band of TMD includes, by way of example and not limitation, nickel (Ni), titanium (Ti) or other suitable metals having a work function lower than a mid-gap work function of TMD.

In some embodiments, the metal source/drain regions 520 are formed of metal(s) having a band-edge work function close to the valence band of the 2D semiconductor material (e.g., TMD), allowing for holes flowing laterally between the source/drain regions 520 through the 2D semiconductor layers 508 when the resultant transistor is turned on, and thus the resultant transistor can act as a p-type transistor. In some embodiments where the 2D semiconductor material is TMD, the metal having a band-edge work function close to the valence band of TMD includes, by way of example and not limitation, palladium (Pd), platinum (Pt), or other suitable metals having a work function higher than a mid-gap work function of TMD.

Figure 27:
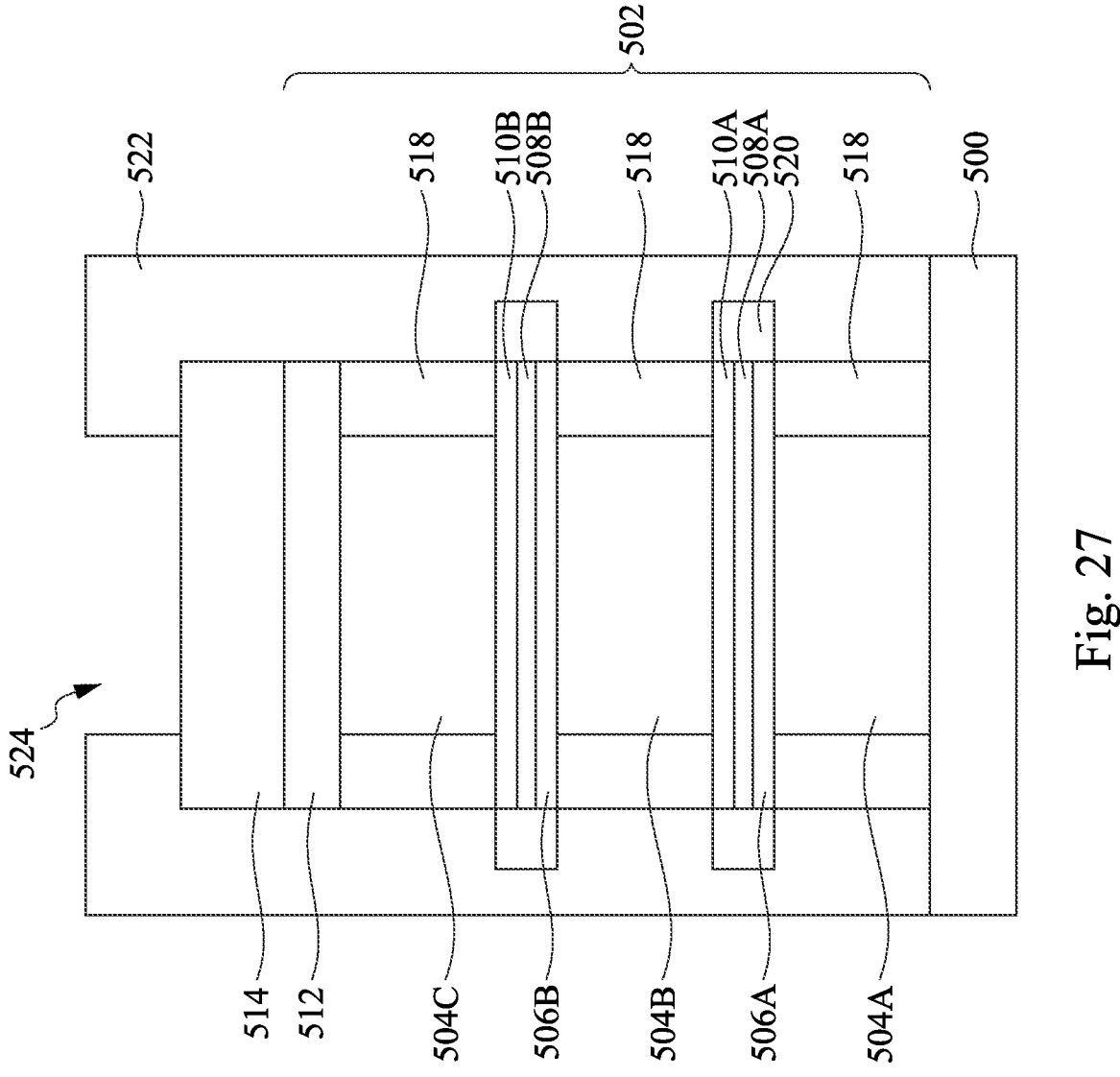

In FIG. 27, an interlayer dielectric (ILD) layer 522 is formed on the substrate 500 and then etched to form a gate trench 524 exposing the multilayer stack 502 but not exposing the metal source/drain regions 520. In some embodiments, the ILD layer 522 may be formed of a suitable dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Figure 28:
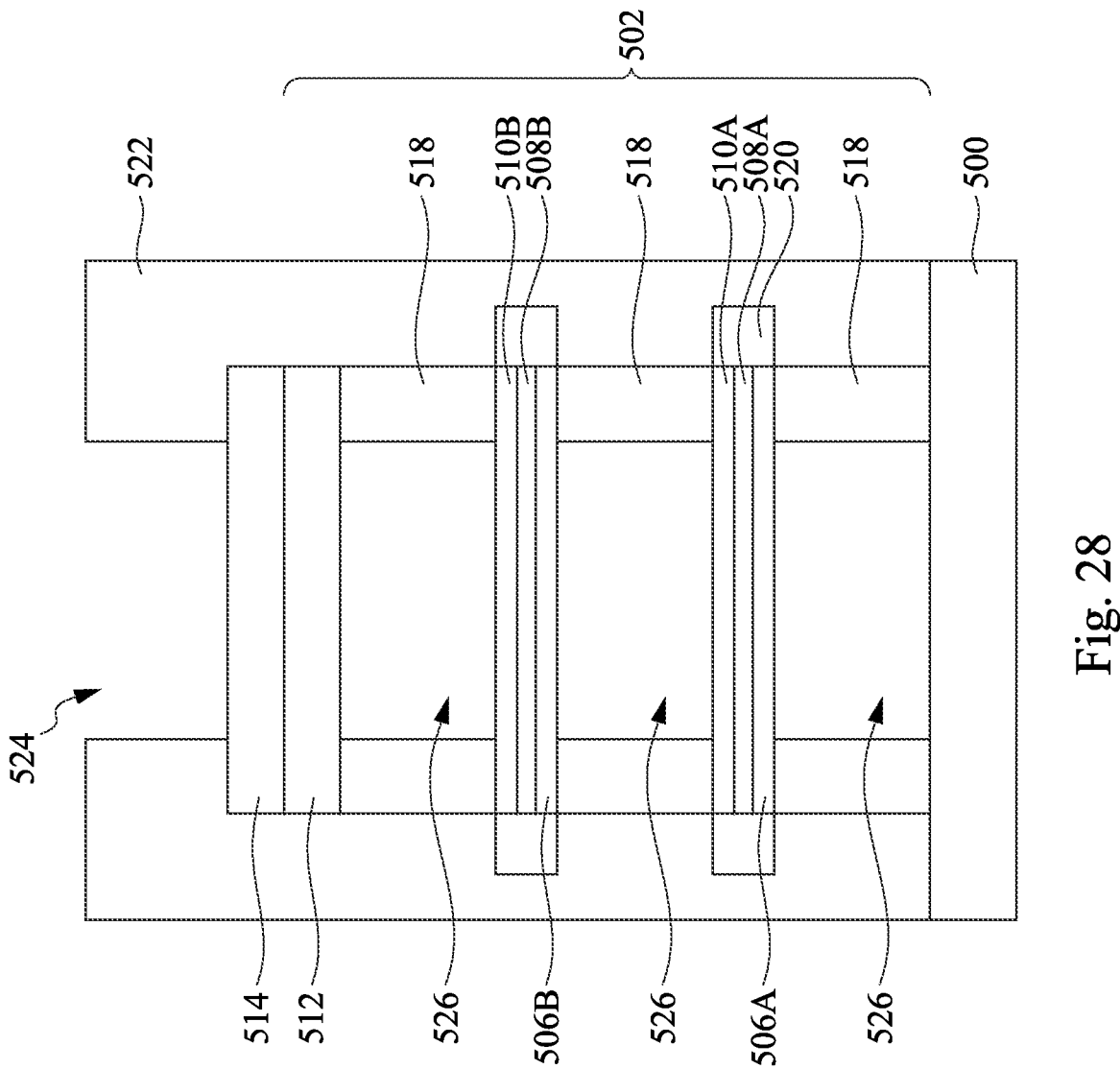

In FIG. 28, the sacrificial epitaxial layers 504 exposed in the gate trench 524 can be removed, for example, by an isotropic etching process such as wet etching or the like using etchants which are selective to the materials of the sacrificial epitaxial layers 504. Stated differently, the sacrificial epitaxial layers 504 are removed by using a selective etching process that etches the sacrificial epitaxial layers 504 at a faster etch rate than it etches the 2D dielectric layers 506, 510, and the 2D semiconductor layers 508, thus forming spaces 526 between the 2D semiconductor layers 508 (also referred to as sheet-to-sheet spaces if the 2D semiconductor layers 508 are nanosheets). This step can be referred to as a channel release process. In some embodiments, the 2D semiconductor layers 508 can be referred to as nanosheets, nanowires, nanoslabs, nanorings having nanoscale size (e.g., a few nanometers), depending on their geometry.

Figure 29A:
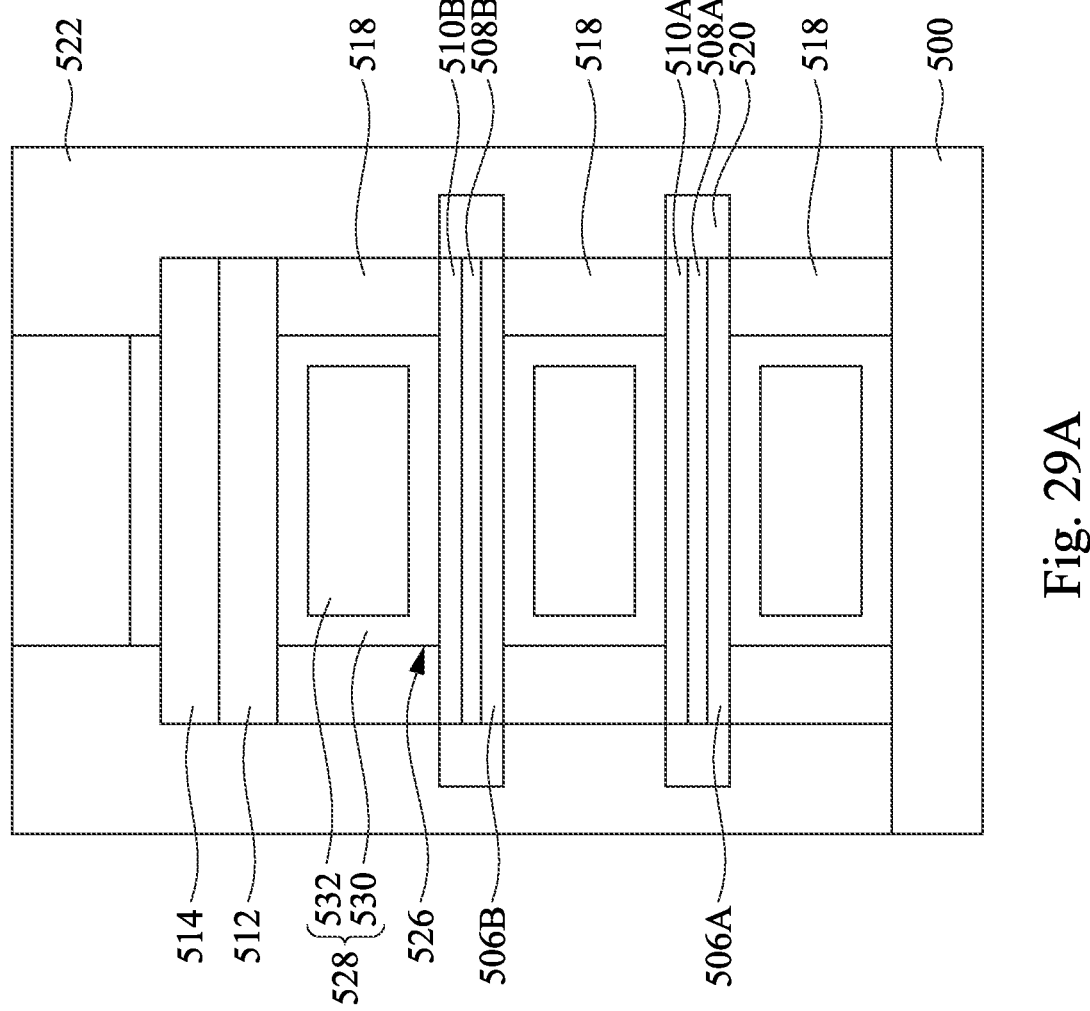
Figure 29B:
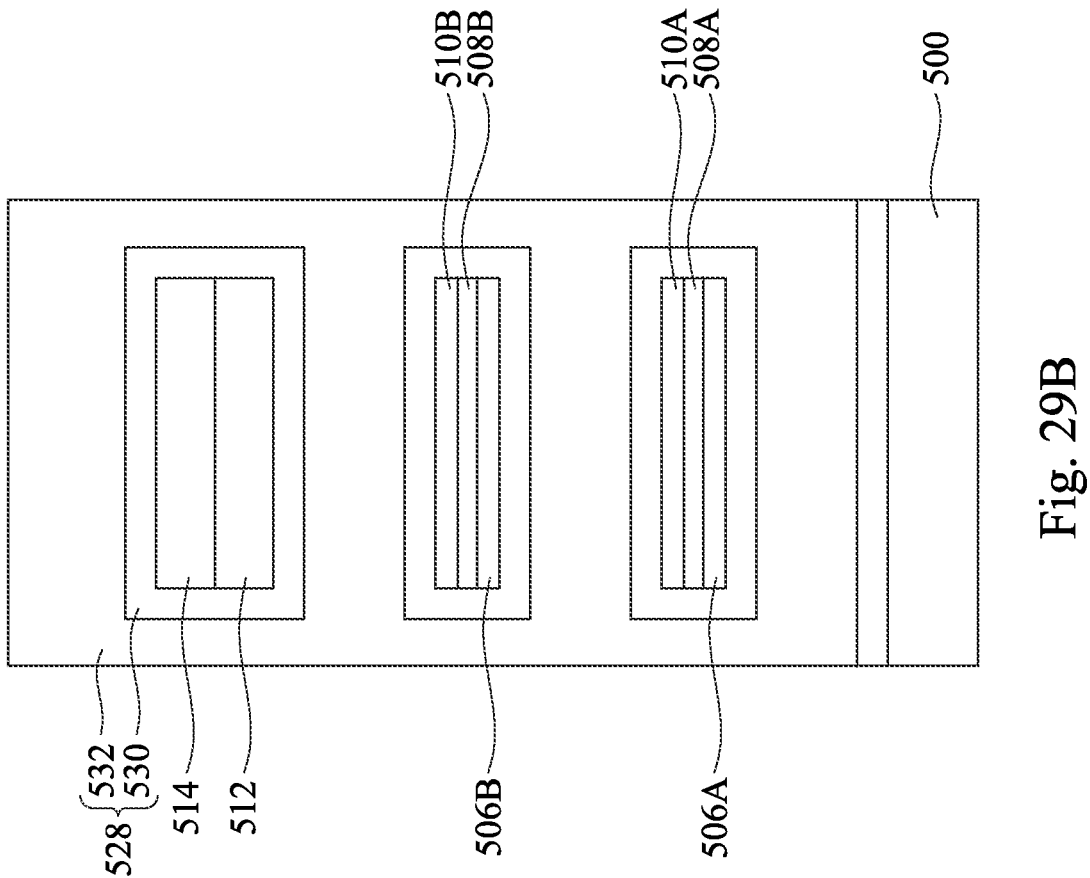

FIG. 29A illustrates a cross-sectional view following a same cut line as that of FIGS. 23-28, and FIG. 29B illustrates a cross-sectional view along a different cut line that is perpendicular to the cut line of FIG. 29A. In FIGS. 29A and 29B, a gate structure 528 is formed in the gate trench 524 to surround each of the 2D semiconductor layers 508 suspended in the gate trench 524. The gate structure 528 may be a final gate of a GAA transistor. The final gate structure 528 may be a high-k/metal gate stack, however other compositions are possible. In some embodiments, the gate structure 528 forms the gate associated with the multi-channels provided by the plurality of 2D semiconductor layers 508. In particular, the high-k/metal gate structure 528 is formed within the sheet-to-sheet spaces provided by the release of 2D semiconductor nanosheets 508. In various embodiments, the high-k/metal gate structure 528 includes a high-k dielectric layer (e.g., non-crystalline dielectric layer) 530 formed around the 2D semiconductor layers 508 and the 2D dielectric layers 206, 510, and a metal gate (e.g., non-crystalline metal gate) 532 formed around the high-k dielectric layer 530 and filling a remainder of gate trench 524. Formation of the high-k/metal gate structure 528 may include one or more deposition processes to form various gate materials, followed by a chemical mechanical planarization (CMP) process to remove excessive gate materials, resulting in the high-k/metal gate structure 528 having a top surface level with a top surface of the ILD layer 522. As illustrated in the cross-sectional view of FIG. 29B, the high-k/metal gate structure 528 surrounds each of the 2D semiconductor layer 508, and thus is referred to as a gate of a GAA FET.

In some embodiments, the high-k dielectric layer 530 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof. In some embodiments, the metal gate 532 includes one or more metal layers. For example, the metal gate 532 may include one or more work function metal layers stacked one over another and a fill metal filling up a remainder of gate trench 524. The one or more work function metal layers in the metal gate 532 provide a suitable work function for the high-k/metal gate structure 528. For an n-type GAA FET, the metal gate 532 may include one or more n-type work function metal (N-metal) layers. The n-type work function metal may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TIC), aluminum carbide (AlC)), aluminides, and/or other suitable materials. On the other hand, for a p-type GAA FET, the metal gate 532 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the metal gate 532 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, as illustrated in the cross-sectional view of FIG. 29B, the 2D semiconductor layers 508 have sidewalls flush with sidewalls of the 2D dielectric layers 506, 510. The high-k dielectric layer 530 has a rectangular ring-shaped profile in contact with the sidewalls of the 2D semiconductor layer 508 and the 2D dielectric layers 506, 510. Horizontal surfaces (i.e., top and bottom surfaces) of each 2D semiconductor layer 508 are spaced apart from the high-k dielectric layer 530 by the 2D dielectric layers 506 and 510. The 2D dielectric layers 506, 510 can thus serve as interfacial layers between the 2D semiconductor layer 508 and the high-k dielectric layer 530, so as to improve the major interface between two dissimilar materials (i.e., the 2D semiconductor material and the non-crystalline high-k dielectric material).

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that epitaxially growing a single-crystalline 2D material layer on a single-crystalline 2D semiconductor layer is achievable. Another advantage is that lattice-matched single-crystalline 2D material layers may help in reducing the defect density and unwanted stain at the interface between adjacent layers, which in turn will lead to improved performance and reliability of semiconductor devices.

In some embodiments, a method includes forming a single-crystalline two-dimensional (2D) semiconductor layer over a substrate; epitaxially growing a single-crystalline 2D material layer on the single-crystalline 2D semiconductor layer, wherein the single-crystalline 2D material layer is lattice-matched with the single-crystalline 2D semiconductor layer; and forming a semiconductor device over the single-crystalline 2D semiconductor layer. In some embodiments, epitaxially growing the single-crystalline 2D material layer comprises epitaxially growing a single-crystalline 2D dielectric material on the single-crystalline 2D semiconductor layer. In some embodiments, the single-crystalline 2D dielectric material comprises hexagonal aluminum nitride or hexagonal gallium nitride. In some embodiments, epitaxially growing the single-crystalline 2D material layer comprises epitaxially growing a single-crystalline 2D metal on the single-crystalline 2D semiconductor layer. In some embodiments, the single-crystalline 2D metal comprises hexagonal hafnium or hexagonal zirconium. In some embodiments, epitaxially growing the single-crystalline 2D material layer comprises epitaxially growing a single-crystalline 2D semiconductor material on the single-crystalline 2D semiconductor layer. In some embodiments, the single-crystalline 2D semiconductor material is different from a material of the single-crystalline 2D semiconductor layer but has a same lattice constant as the material of the single-crystalline 2D semiconductor layer. In some embodiments, the single-crystalline 2D semiconductor material comprises molybdenum disulfide ($MoS_2$) or tungsten disulfide ($MoS_2$). In some embodiments, the method further comprises forming a single-crystalline layer lattice-matched with the single-crystalline 2D material layer. In some embodiments, the method further comprises forming a non-crystalline layer on the single-crystalline 2D material layer.

In some embodiments, a method comprises forming a 2D semiconductor layer over a substrate; forming a 2D dielectric layer over the 2D semiconductor layer, wherein the 2D dielectric layer is lattice-matched with the 2D semiconductor layer; forming a metal gate over the 2D dielectric layer; and forming source/drain regions on opposite sides of the metal gate. In some embodiments, forming the metal gate comprises epitaxially growing a 2D metal on the 2D dielectric layer. In some embodiments, the 2D metal is lattice-matched with the 2D dielectric layer. In some embodiments, the 2D metal comprises hexagonal hafnium or hexagonal zirconium. In some embodiments, the 2D dielectric layer comprises hexagonal aluminum nitride or hexagonal gallium nitride. In some embodiments, the 2D semiconductor layer comprises molybdenum disulfide ($MoS_2$) or tungsten disulfide ($MoS_2$). In some embodiments, the method further comprises forming a high-k dielectric layer over the 2D dielectric layer, and the metal gate is formed over the high-k dielectric layer.

In some embodiments, a device comprises a first 2D semiconductor layer over a substrate, a first 2D dielectric layer lattice-matched with the first 2D semiconductor layer, a metal gate spaced apart from the first 2D semiconductor layer at least in part by the first 2D dielectric layer, and first source/drain regions interfacing the first 2D semiconductor layer. The metal gate is laterally between the first source/drain regions. In some embodiments, the device further comprises a second 2D dielectric layer lattice-matched with the first 2D semiconductor layer. The first 2D semiconductor layer is between the first 2D dielectric layer and the second 2D dielectric layer. In some embodiments, the device further comprises a second 2D semiconductor layer above the first 2D semiconductor layer and spaced apart from the first 2D semiconductor layer at least in part by the metal gate, a second 2D dielectric layer lattice-matched with the second 2D semiconductor layer, and second source/drain regions interfacing the second 2D semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a 2D semiconductor layer over a substrate;

forming a 2D dielectric layer over the 2D semiconductor layer, wherein the 2D dielectric layer is lattice-matched with the 2D semiconductor layer;

forming a metal gate over the 2D dielectric layer, wherein forming the metal gate comprises epitaxially growing a 2D metal on the 2D dielectric layer, wherein the 2D metal is disposed above the 2D dielectric layer; and forming source/drain regions on opposite sides of the metal gate.

2. The method of claim 1, wherein the 2D metal is lattice-matched with the 2D dielectric layer.

3. The method of claim 1, wherein the 2D metal comprises hexagonal hafnium or hexagonal zirconium.

4. The method of claim 1, wherein the 2D dielectric layer comprises hexagonal aluminum nitride or hexagonal gallium nitride.

5. The method of claim 1, wherein the 2D semiconductor layer comprises molybdenum disulfide ($MoS_2$) or tungsten disulfide ($WS_2$).

6. The method of claim 1, further comprising:

forming a high-k dielectric layer over the 2D dielectric layer, wherein the metal gate is formed over the high-k dielectric layer.

7. The method of claim 1, wherein forming the metal gate further comprising:

after epitaxially growing the 2D metal on the 2D dielectric layer, performing an etching process to etch the 2D metal into the metal gate, while leaving the 2D dielectric layer intact.

8. A method comprising:

forming a 2D semiconductor layer over a substrate;

forming a 2D dielectric layer over the 2D semiconductor layer, wherein the 2D dielectric layer is lattice-matched with the 2D semiconductor layer;

forming a metal gate over the 2D dielectric layer, wherein forming the metal gate comprises epitaxially growing a 2D metal to cover a top surface of the 2D dielectric layer; and forming source/drain regions on opposite sides of the metal gate.

9. The method of claim 8, wherein the 2D dielectric layer is a single-crystalline 2D dielectric layer.

10. The method of claim 8, wherein the 2D dielectric layer is formed of hexagonal aluminum nitride or hexagonal gallium nitride.

11. The method of claim 8, wherein a difference between a lattice constant of the metal gate and a lattice constant of the 2D dielectric layer is less than 5% of the lattice constant of the 2D dielectric layer.

12. The method of claim 8, wherein the metal gate is a single-crystalline 2D metal.

13. The method of claim 12, wherein the single-crystalline 2D metal is hexagonal hafnium or hexagonal zirconium.

14. A method comprising forming a 2D semiconductor layer over a substrate;

forming a 2D dielectric layer over the 2D semiconductor layer, wherein the 2D dielectric layer is lattice-matched with the 2D semiconductor layer;

forming a metal gate over the 2D dielectric layer, wherein forming the metal gate comprises epitaxially growing a 2D metal on the 2D dielectric layer, wherein the 2D metal is at a higher level than a 2D dielectric layer; and forming source/drain regions on opposite sides of the metal gate.

15. The method of claim 14, wherein the metal gate comprises hexagonal hafnium with a lattice constant of about 3.20 angstroms, or hexagonal zirconium with a lattice constant of about 3.23 angstroms.

16. The method of claim 14, wherein the 2D dielectric layer comprises hexagonal aluminum nitride with a lattice constant of about 3.13 angstroms, or hexagonal gallium nitride with a lattice constant of about 3.22 angstroms.

17. The method of claim 14, wherein the metal gate comprises a 2D metal layer, wherein a number of monolayers of the 2D metal layer is greater than a number of monolayers of the 2D dielectric layer.

18. The method of claim 14, wherein a number of monolayers of the 2D dielectric layer is greater than a number of monolayers of the 2D semiconductor layer.

19. The method of claim 14, wherein the 2D dielectric layer is single-crystalline.

20. The method of claim 14, wherein the metal gate is single-crystalline.

* * * * *